US007348285B2

(12) United States Patent
Dhawan et al.

(10) Patent No.: US 7,348,285 B2
(45) Date of Patent: Mar. 25, 2008

(54) FABRIC AND YARN STRUCTURES FOR IMPROVING SIGNAL INTEGRITY IN FABRIC-BASED ELECTRICAL CIRCUITS

(75) Inventors: Anuj Dhawan, Raleigh, NC (US); Tushar K. Ghosh, Cary, NC (US); Abdelfattah M. Seyam, Cary, NC (US); John Muth, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 10/609,074

(22) Filed: Jun. 27, 2003

(65) Prior Publication Data

US 2004/0057176 A1 Mar. 25, 2004

Related U.S. Application Data

(60) Provisional application No. 60/447,438, filed on Feb. 14, 2003, provisional application No. 60/392,591, filed on Jun. 28, 2002.

(51) Int. Cl.
*D03D 15/02* (2006.01)
(52) U.S. Cl. ................ 442/229; 442/4; 442/6; 442/189; 442/228; 442/301; 174/107; 174/108; 57/210; 57/211; 426/377; 426/592; 333/123; 333/160; 333/206
(58) Field of Classification Search ............... 442/4, 442/6, 189, 228, 229, 301; 174/102 R, 105 R, 174/107, 108; 57/200, 204, 210, 211; 428/592, 428/36.9, 113, 364, 377; 333/81, 123, 160, 333/222, 206
See application file for complete search history.

(56) References Cited

U.S. PATENT DOCUMENTS

| 1,745,096 | A | * | 1/1930 | Jayne ........................ 455/270 |
| 2,073,933 | A | * | 3/1937 | Herbst ........................ 178/45 |
| 2,387,783 | A | * | 10/1945 | Tawney ...................... 333/160 |
| 2,854,639 | A | * | 9/1958 | Nordlin ...................... 333/160 |
| 3,277,564 | A | * | 10/1966 | Webber et al. ............. 29/419.1 |
| 3,745,287 | A | | 7/1973 | Walker |

(Continued)

OTHER PUBLICATIONS

Unitek Equipment, "Thin-Line(TM) Weld Heads—High Performance, Durability & Long Life 80 Series, 180 Series, 90 Series," p. 1-8, (Jul. 2001).

(Continued)

*Primary Examiner*—Andrew T Piziali
(74) *Attorney, Agent, or Firm*—Jenkins, Wilson, Taylor & Hunt, P.A.

(57) ABSTRACT

Coaxial and twisted pair conductive yarn structures reduce signal crosstalk between adjacent lines in woven electrical networks. A coaxial conductive yarn structure includes an inner conductive yarn having a plurality of conductive strands twisted together. An outer conductive yarn is wrapped around the inner conductive yarn. An insulating layer separates the inner and outer yarns. A twisted pair conductive yarn structure includes first and second conductive yarns, each including a plurality of conductive strands being twisted together. The first and second conductive yarns are twisted together to form a helical structure. In a woven electrical network, at least one conductor of adjacent conductive yarn structures is connected to ground to reduce signal crosstalk. Coaxial and twisted pair yarn structures may also be formed simultaneously with weaving or knitting the threads that make up the structures into a fabric.

15 Claims, 34 Drawing Sheets

U.S. PATENT DOCUMENTS

| | | | |
|---|---|---|---|
| 3,795,760 A * | 3/1974 | Raw et al. | 174/128.1 |
| 3,933,520 A | 1/1976 | Gay et al. | |
| 4,091,176 A | 5/1978 | Alfenaar | |
| 4,129,677 A | 12/1978 | Boe | |
| 4,199,637 A | 4/1980 | Sado | |
| 4,247,596 A | 1/1981 | Yee | |
| 4,255,973 A | 3/1981 | Karplus | |
| 4,267,233 A | 5/1981 | Tanaka et al. | |
| 4,308,533 A | 12/1981 | Schmidt | |
| 4,350,580 A | 9/1982 | Kadija | |
| 4,417,959 A | 11/1983 | Kadija et al. | |
| 4,429,179 A | 1/1984 | Chynoweth | |
| 4,432,838 A | 2/1984 | Kadija | |
| 4,439,303 A | 3/1984 | Cocchi | |
| 4,463,323 A | 7/1984 | Piper | |
| 4,552,989 A * | 11/1985 | Sass | 174/103 |
| 4,590,120 A * | 5/1986 | Klein | 442/340 |
| 4,639,825 A | 1/1987 | Breidegam | |
| 4,654,748 A | 3/1987 | Rees | |
| 4,661,376 A | 4/1987 | Liang | |
| 4,664,158 A | 5/1987 | Sands | |
| 4,664,971 A | 5/1987 | Soens | |
| 4,676,561 A | 6/1987 | Barrett, II | |
| 4,719,320 A * | 1/1988 | Strait, Jr. | 174/106 R |
| 4,735,847 A | 4/1988 | Fujiwara et al. | |
| 4,743,349 A | 5/1988 | Bachot et al. | |
| 4,803,096 A | 2/1989 | Kuhn et al. | |
| 4,820,170 A | 4/1989 | Redmond et al. | |
| 4,889,963 A | 12/1989 | Onai | |
| 4,918,814 A | 4/1990 | Redmond et al. | |
| 4,929,803 A | 5/1990 | Yoshida et al. | |
| 4,931,616 A * | 6/1990 | Usui et al. | 219/121.68 |
| 4,975,317 A | 12/1990 | Kuhn et al. | |
| 5,102,727 A | 4/1992 | Pittman et al. | |
| 5,162,135 A | 11/1992 | Gregory et al. | |
| 5,173,366 A | 12/1992 | Mitamura et al. | |
| 5,177,187 A | 1/1993 | MacDiarmid et al. | |
| RE34,233 E | 4/1993 | Bachot et al. | |
| 5,246,797 A | 9/1993 | Imhof et al. | |
| 5,248,468 A | 9/1993 | Mitamura et al. | |
| 5,281,171 A | 1/1994 | Job | |
| 5,292,573 A | 3/1994 | Adams, Jr. et al. | |
| 5,316,830 A | 5/1994 | Adams, Jr. et al. | |
| 5,398,547 A | 3/1995 | Gerardi et al. | |
| 5,420,465 A | 5/1995 | Wallace et al. | |
| 5,624,736 A | 4/1997 | DeAngelis et al. | |
| 5,636,378 A | 6/1997 | Griffith | |
| 5,689,791 A | 11/1997 | Swift | |
| 5,698,148 A | 12/1997 | Asher et al. | |
| 5,720,892 A | 2/1998 | DeAngelis et al. | |
| 5,776,608 A | 7/1998 | Asher et al. | |
| 5,788,897 A | 8/1998 | Hsu | |
| 5,802,607 A | 9/1998 | Triplette | |
| 5,874,672 A | 2/1999 | Gerardi et al. | |
| 5,878,620 A | 3/1999 | Gilbert et al. | |
| 5,906,004 A * | 5/1999 | Lebby et al. | 2/1 |
| 5,952,099 A | 9/1999 | Asher et al. | |
| 6,044,287 A | 3/2000 | Cornell | |
| 6,051,335 A | 4/2000 | Dinh-Sybeldon et al. | |
| 6,080,690 A | 6/2000 | Lebby et al. | |
| 6,120,939 A | 9/2000 | Whear et al. | |
| 6,123,883 A | 9/2000 | Mattes et al. | |
| 6,145,551 A | 11/2000 | Jayaraman et al. | |
| 6,158,884 A | 12/2000 | Lebby et al. | |
| 6,210,771 B1 | 4/2001 | Post et al. | |
| 6,381,482 B1 | 4/2002 | Jayaraman et al. | |
| 6,852,395 B2 | 2/2005 | Dhawan et al. | |

OTHER PUBLICATIONS

Post et al., "E-broidery: Design and Fabrication of Textile-Based Computing," IBM Systems Journal, p. 840-860, (2000), no month.

Gorlick, "Electric Suspenders: A Fabric Power Bus and Data Network for Wearable Digital Devices, " The 3rd International Symposium on Wearable Computers, p. 114-121. (1998), no month.

Post et al., "Smart Fabric, or 'Wearable Clothing', " Proceedings of First International Symposium on Wearable Computers, p. 167-168, (1997), no month.

Inaba et al., "A Full-Body Tactile Sensor Suit Using Electronically Conductive Fabric and Strings, " Proceedings of the IEEE/RSJ International Conference on Intelligent Robots and Systems, p. 450-457, (1996), no month.

Unitek Equipment, "Unibound II—Advanced microjoining System, " p. 1-4, (Jul. 1995).

Inaba et al., "A Full-Body Tactile Sensor Suit Using Electronically Conductive Fabric and Strings, " Proceedings of the IEEE/RSJ International Conference on Intelligent Robots and Systems, p. 450-457, (1996), no month.

Azoulay, "Anisotropy in Electric Properties of Fabrics Containing New Conductive Fibers, " IEEE Transactions on Electrical Insulation, vol. 23 (No. 3), p. 383-386, (1988), no month.

Brews, "Transmission Line Models for Lossy Waveguide Interconnections in VLSI, " IEEE Transactions on Electron Devices, p. 1356-1365, (1986), no month.

* cited by examiner

FABRIC AND YARN STRUCTURES FOR IMPROVING SIGNAL INTEGRITY IN FABRIC-BASED ELECTRICAL CIRCUITS

RELATED APPLICATIONS

This application claims the benefit of U.S. Provisional Patent Application Ser. No. 60/392,591, filed Jun. 28, 2002 and U.S. Provisional Patent Application Ser. No. 60/447,438, filed Feb. 14, 2003, the disclosures of each of which are incorporated herein by reference in their entirety.

GOVERNMENT INTEREST

This invention was made with U.S. Government support under Grant No. N39998-98-C3566 awarded by the Department of Defense-Defense Advanced Research Projects Agency. The U.S. Government has certain rights in the invention.

TECHNICAL FIELD

The present invention relates to methods and systems for improving signal integrity in fabric-based electrical circuits. More particularly, the present invention relates to new fabric and yarn structures and methods for making the same for solving signal integrity related problems, such as crosstalk, in woven or knitted electrical networks.

BACKGROUND ART

The demand for flexible electrical circuits and circuit boards is increasing in the fields of electronics and computer engineering. Circuit boards have traditionally been rigid structures that use polymeric or epoxy-based material as the dielectric. Copper wiring or interconnect patterns are inscribed on the circuit boards using photolithography or electron beam lithography to obtain a desired wiring pattern. Using rigid circuit boards may not be desirable in all applications as they are inflexible and non-conformable and also due to the fixed volume occupied by such circuit boards.

In response to the problems associated with conventional rigid circuit boards, flexible circuit boards have been developed. One type of flexible circuit board that has been developed includes textiles-based circuit boards. Textiles-based circuit boards and the corresponding electrical circuits include both conductive fibers and nonconductive fibers. The conductive fibers can be used to interconnect electrical components to form an electrical circuit. A fabric-based electrical network can be incorporated into a garment and worn by the user. Such networks have applications in the fields of medicine, communications, electronics, automobiles, and space exploration. One recent application of fabric-based electrical networks is uniforms for military personnel.

One problem with fabric-based electrical networks is AC signal crosstalk between adjacent conductors. When conductors in fabric-based electrical networks are placed parallel and close to each other (though not in direct contact with each other), capacitive and inductive signal crosstalk between neighboring lines can occur. Such crosstalk leads to distortion of signals in neighboring lines that carry electrical signals. In addition, on quiet lines adjacent to a signal-carrying line, crosstalk can cause peaks or troughs due to the rise and fall and electrical signals on the signal-carrying line.

In light of these problems associated with conventional fabric-based electrical networks, there exists a need for improved methods and systems for improving signal integrity in fabric-based electrical circuits.

DISCLOSURE OF THE INVENTION

The present invention includes conductive yarn structures and fabrics containing conductive yarn structures for improving signal integrity in fabric-based electrical circuits. As used herein, the term "conductive yarn" is intended to refer to a group of conductive strands that are twisted together to form a single conductor and exhibiting sufficient flexibility, conformability, resiliency, bending characteristics, and recovery required for fabric-based circuits to be incorporated in wearable garments. Examples of conductive strand material suitable for forming conductive yarns includes copper, steel, gold, aluminum, silver, iron, any of the alloys from the above mentioned materials, and conductive polymers (inherently conductive polymeric materials, such as polypyrrole, polyacetylene, polythiophene and polyaniline, doped conductive polymeric materials, carbon black-doped/impregnated polymeric yarns, metal coated polymeric yarns or fibers and conductive yarns of suitable types). The term "yarn" is intended to refer to a group of strands (like filaments, fibers, or fine wires) being twisted together to form a single structure. These strands may be continuous or non-continuous along the length of the twisted yarn. A yarn may consist of only one continuous strand (monofilament yarn). In the case of monofilament yarns, the term "yarn" includes filaments and fibers. In the case of monofilament yarns, the term "yarn" includes only very fine wires i.e. with a wire diameter (i.e. monofilament yarn diameter) less than 20 microns. The term "yarn" is not intended to include conventional wires. As indicated above, the term "yarn," as used herein, refers to a structure that exhibits sufficient flexibility, conformability, resiliency, bending characteristics, and recovery required for fabric-based circuits to be incorporated in wearable garments. Conventional wires lack one or more of these characteristics, making them unsuitable for incorporation in a fabric. The individual strands forming the yarn may be very fine wires (twisted to form the yarn) but the diameter of these fine wires should ideally be less than 20 microns to provide sufficient flexibility and conformability of the yarn (twisted strand structure).

One conductive yarn structure of the present invention is a coaxial conductive yarn structure. In a coaxial conductive yarn structure, a first conductive yarn extends in a first direction and has a plurality of conductive strands that are twisted together. An insulating layer surrounds the conductive strands. A second conductive yarn, which also has a plurality of conductive strands being twisted to each other, is wrapped around the insulating layer in a second direction transverse to the first direction. An insulating layer may surround the second conductive strand.

Another conductive yarn structure suitable for reducing crosstalk in a fabric-based electrical network is a twisted pair conductive yarn structure. A twisted pair conductive yarn structure includes a first conductive yarn having a plurality of conductive strands being twisted together (and also having an insulating layer surrounding the twisted strands). An insulating layer surrounds the conductive strands. A second conductive yarn, also having a plurality of strands being twisted together, is twisted together with the first conductive yarn to form a helical structure.

In a woven electrical network including coaxial conductive yarn structures, first and second coaxial conductive yarns are woven (parallel to each other but separated from each other by non-conducting yarns) into a fabric in one direction. The inner conductive yarn of one of the conductive yarn structures may be connected to a signal source. The outer conductive yarn of one or both of these coaxial conductive yarn structures may be connected to ground. When an AC signal is applied to the inner conductor of the first coaxial conductive yarn structure (and/or the inner conductor of the second coaxial conductive yarn structure), the outer conductive yarns of the first and second coaxial conductive yarn structures are grounded and block electromagnetic fields emanating from the inner conductive yarn of the first coaxial conductive yarn structure and thereby reduce crosstalk between the first and second coaxial conductive yarn structures. In a woven electrical network one may also have multiple (more than two) strands of coaxial conductive yarn structures woven into the fabric in one or two of the orthogonal directions (warp and weft directions) of the woven fabric.

As used herein, the term "electrical network" may be used interchangeably with the term "electrical circuit".

Another woven electrical network of the present invention includes first and second twisted pair conductive yarn structures. Each of the first and second twisted pair conductive yarn structures is woven to a fabric in a first direction. One conductor in each of the twisted pair conductive yarn structures is connected to ground. The other conductor in at least one of the twisted pair conductive yarn structures is connected to an AC signal source. When the AC signal is applied to the conductor, the grounded second conductors of the twisted pair conductive yarn structures block electromagnetic fields emanating from the first conductive yarn of the first twisted pair conductor and thereby reduce crosstalk between the first and second twisted pair conductive yarn structures.

According to another aspect, the present invention includes methods and systems for creating conductive thread structures with improved crosstalk resistance while the thread structures are being woven or knitted into a fabric. For example, a coaxial structure may be created by leno weaving conductive threads into a fabric. A similar process may be used to create a twisted pair structure while leno weaving the yarns that make up the twisted pair structure into a fabric. One advantage of creating the structures while the structures are being woven or knitted into a fabric is that the time required to produce such structures is reduced over methods where coaxial or twisted pair structures are formed in advance of making the fabric. Another advantage of forming the structures during the knitting or weaving process is that the weaving can be altered during the formation of the structures to create floats for selective electrical connection and disconnection.

As used herein, the term "thread" may be used interchangeably with the term "yarn".

Accordingly, it is an object of the invention to provide improved methods and systems for reducing crosstalk in fabric-based circuits.

It is another object of the invention to provide improved conductive yarn structures for improving signal integrity in fabric-based electrical circuits.

It is another object of the invention to provide methods for making coaxial and twisted pair structures while the structures are being knitted or woven into a fabric.

Some of the objects of the invention having been stated hereinabove, other objects will become evident as the description proceeds when taken in connection with the accompanying drawings as best described hereinbelow.

BRIEF DESCRIPTION OF THE DRAWINGS

Preferred embodiments of the invention will now be explained with reference to the accompanying drawings of which.

DETAILED DESCRIPTION OF THE INVENTION

Figure 1:
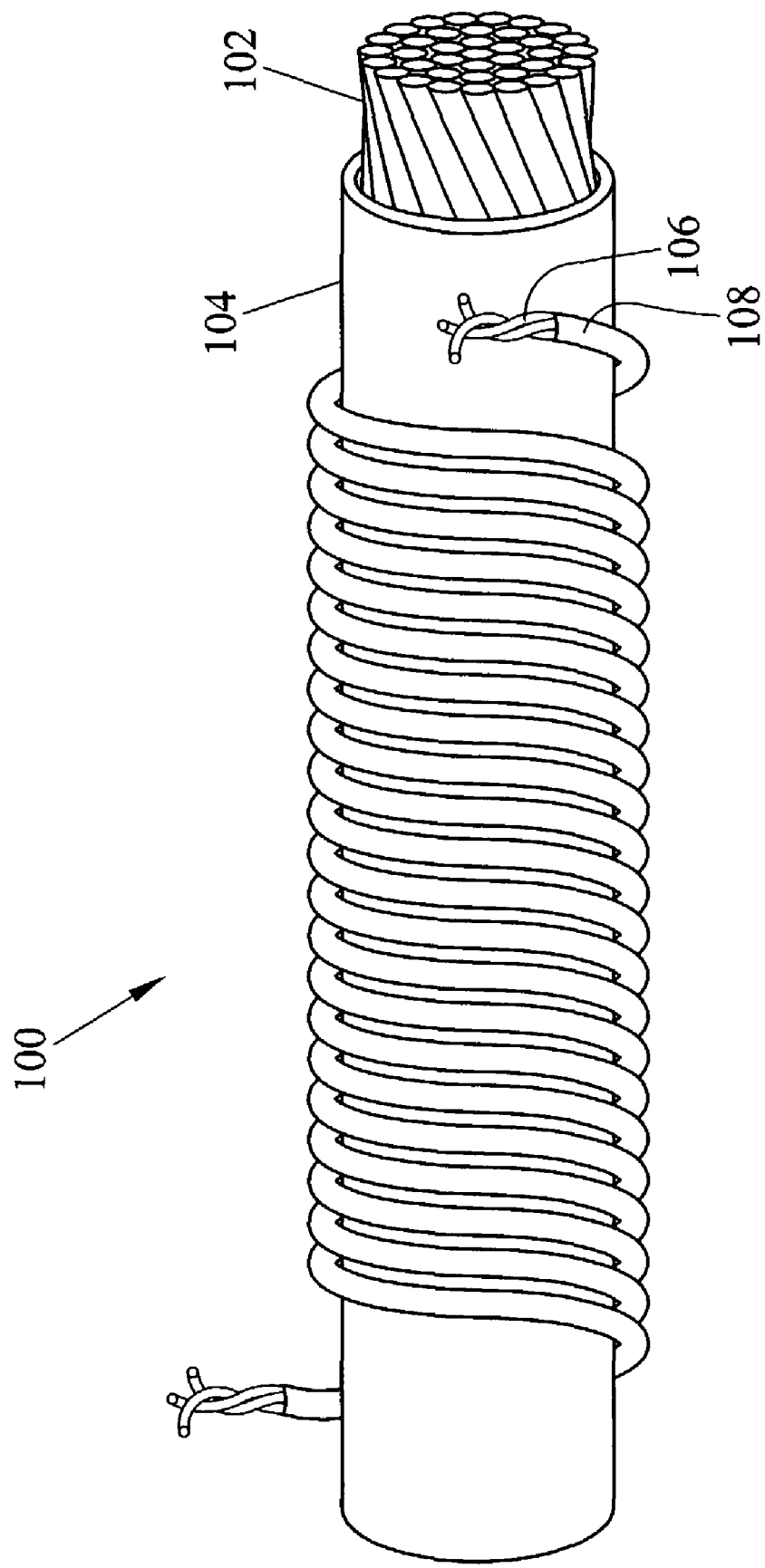
FIG. 1 is a perspective view of a coaxial conductive yarn structure for improving signal integrity in fabric-based electrical networks according to an embodiment of the present invention.

The present invention includes conductive yarn structures for improving signal integrity in fabric-based electrical networks. FIG. 1 illustrates an example of one conductive yarn structure suitable for improving signal integrity in fabric-based electrical networks according to an embodiment of the present invention. Referring to FIG. 1, a conductive yarn structure 100 comprises a coaxial conductive yarn structure. Coaxial conductive yarn structure 100 includes an inner conductive yarn 102 surrounded by an insulating layer 104 and an outer conductive yarn 106, which is preferably also surrounded by an insulating layer 108. Inner conductive yarn 102 includes a plurality of conductive strands being twisted together. The conductive strands may be made of any suitable conductive material, such as such as copper, gold, steel, aluminum, silver, or iron or conductive polymers (inherently conductive polymeric materials, such as polypyrrole, polyacetylene, polythiophene and polyaniline, doped conductive polymeric materials, carbon black-doped/impregnated polymeric yarns, metal coated polymeric yarns or fibers and conductive yarns of all different kinds). Outer conductive yarn 106 also includes a plurality of strands being twisted together. In one example, outer conductive yarn 106 may be made of silver-coated nylon or any of the above-mentioned conducting materials. Insulating layers 104 and 108 may be made of any suitable insulating material, such as polyvinylchloride; rubber; rubber forming polymers, including polyisoprene, polybutadiene, polychloroprene, and polyisobutylene; polyesters; polyolefins; and polyamides. In one example, insulating layers 104 and 108 may be made of polyvinylchloride.

It is important to note that structures 102 and 106 are yarns, rather than wires. The term "yarn" is defined above and is not intended to include conventional wires. As indicated above, the term "yarn," as used herein, refers to a structure that exhibits sufficient flexibility, conformability, resiliency, bending characteristics, and recovery required for fabric-based circuits to be incorporated in wearable garments. Conventional wires lack one or more of these characteristics, making them unsuitable for incorporation in a fabric. The individual strands forming the yarn may be very fine wires twisted to form the yarn, but the diameter of these fine wires should ideally be less than 20 microns to provide sufficient flexibility and conformability of the yarn or twisted strand structure.

Coaxial conductive yarn structure 100 may be constructed by first forming inner and outer conductive yarns 102 and 106. These yarns may be formed using conventional yarn twisting techniques. Once the inner and outer conductive yarns are formed, insulating layers 104 and 108 may be applied to either or both yarns. Inner conductive yarn 102 and outer conductive yarn 106 may then be fed into a yarn covering machine or a yarn wrapping machine. The yarn covering or wrapping machine may wind or wrap outer conductive yarn 106 around inner conductive yarn 102. A yarn covering machine used for wrapping a yarn around an elastomeric core yarn could be used to develop the coaxial yarn structure. In that case, in order to reduce the likelihood of breakage, the wrapping speed of the yarn covering machine is preferably reduced over that used for wrapping elastomeric yarns. The wrapping of conductive yarns 106 around the conductive yarn 102 can also be carried out using a yarn twisting machine (for example, a ring twister) to wrap yarn 106 with insulation 108 around yarn 102 with insulation 104.

Figure 2:
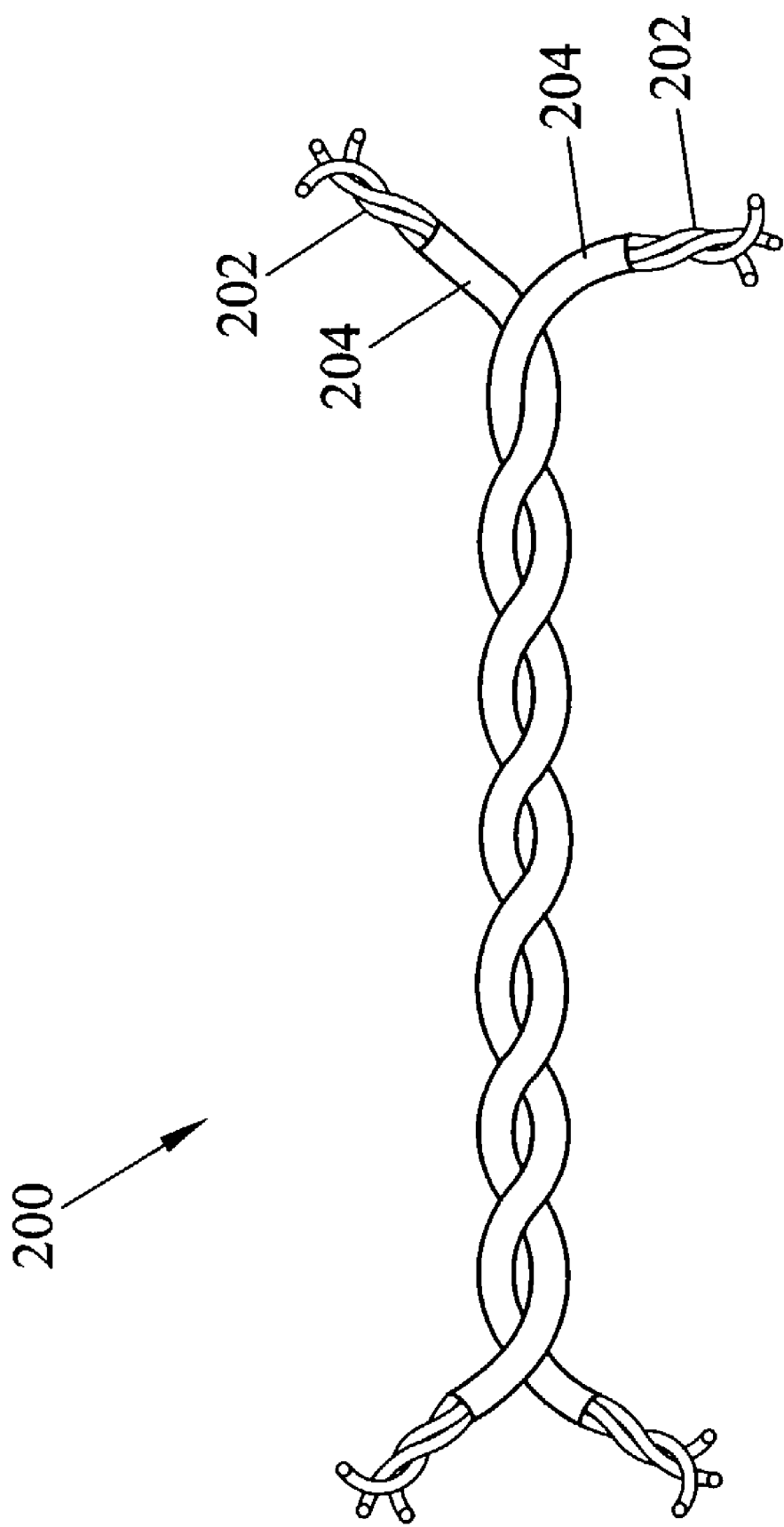
FIG. 2 is a perspective view of a twisted pair conductive yarn structure for improving signal integrity in a fabric-based electrical network according to an embodiment of the present invention.

FIG. 2 illustrates another example of a conductive yarn structure suitable for improving signal integrity in a fabric-based signal transmission system according to an embodiment of the present invention. Referring to FIG. 2, conductive yarn structure 200 comprises a twisted pair conductive yarn structure. Twisted pair conductive yarn structure 200 includes first and second conductive yarns 202 surrounded by insulating layers 204 and being twisted together to form a helical structure. Conductive yarns 202 are preferably made of multiple strands of a conductive material, such as copper, gold, steel, aluminum, silver, iron, any of the alloys from the above mentioned materials, and conductive polymers (inherently conductive polymeric materials, such polypyrrole, polyacetylene, polythiophene and polyaniline, doped conductive polymeric materials, carbon black-doped/impregnated polymeric yarns, metal coated polymeric yarns, or fibers and conductive yarns of all different kinds). As with the coaxial structure described above, the multiple strands are preferably twisted together to form a yarn. Insulating layer 204 may be made of any suitable insulating material, such as polyvinylchloride; rubber; rubber forming polymers, including polyisoprene, polybutadiene, polychloroprene, and polyisobutylene; polyesters; polyolefins; and polyamides. The strands that form conductive yarns 202 may be twisted together using a conventional yarn twisting machine, as described above. Once conductive yarns 202 have been formed, insulating layers 204 are preferably added to conductive yarns 202. Conductive yarns 202 are preferably then twisted into a helical structure using a yarn twisting machine.

Figure 3:
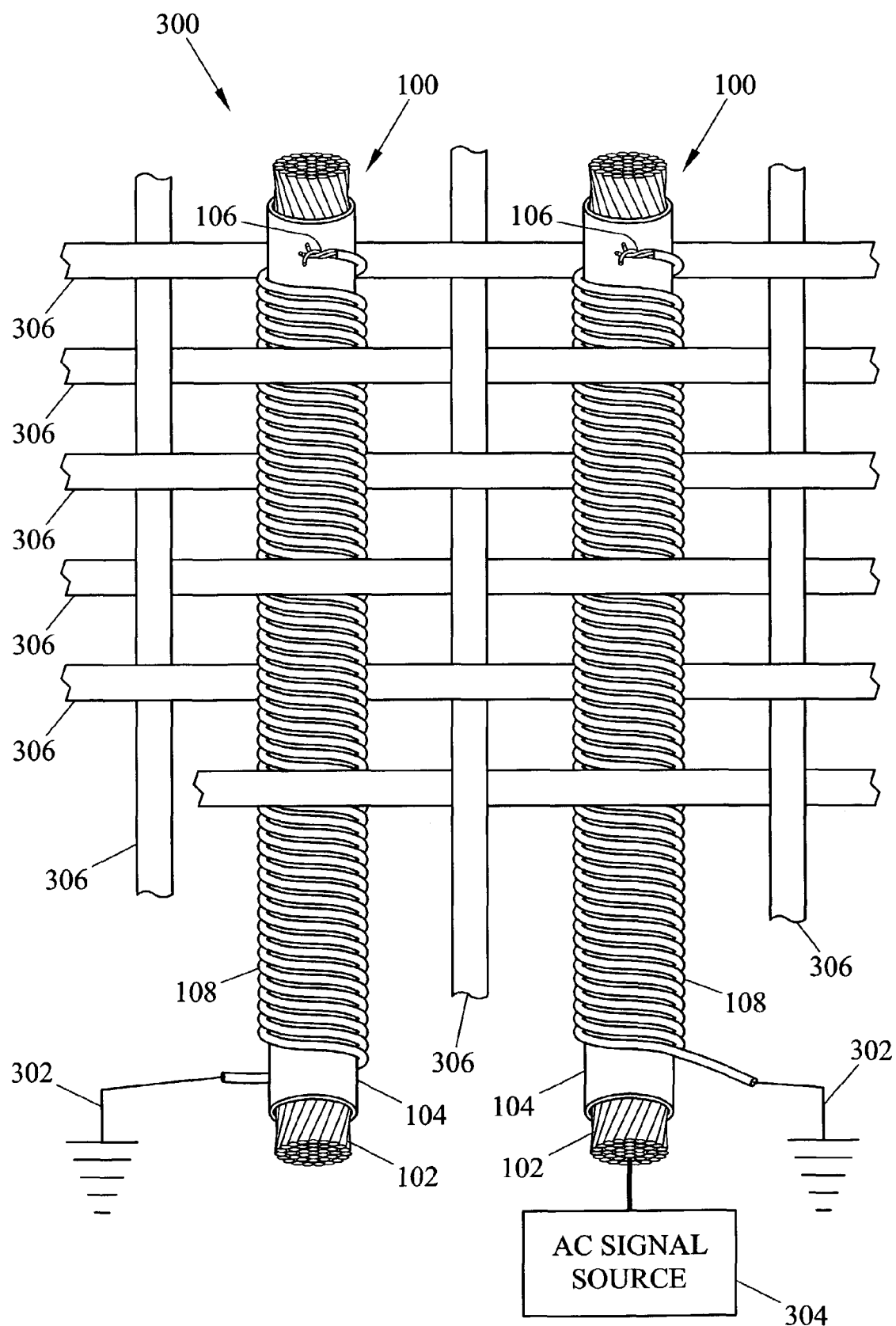
FIG. 3 is a top view of a fabric-based electrical network including first and second coaxial conductive yarn structures according to an embodiment of the present invention.

FIG. 3 illustrates an example of a woven electrical network including coaxial conductive yarn structures according to an embodiment of the present invention. In the illustrated example, woven electrical network 300 includes coaxial conductive yarn structures 100. Coaxial conductive yarn structures 100 are incorporated in woven electrical network 300 and extend in a direction parallel to each other. For example, coaxial conductive yarn structures 100 may be weft or warp yarns or both woven into a fabric.

According to an important aspect of the invention, outer conductors 106 of coaxial conductive yarn structures 100 are preferably connected to ground 302. In a preferred embodiment of the invention, outer conductors 106 may be welded to a signal ground at a fabric crossover point, for example, as described in commonly-assigned, co-pending U.S. patent application Ser. No. 10/041,248 filed Jan. 8, 2002, the disclosure of which is incorporated herein by reference in its entirety. Connecting outer conductors 106 to ground blocks electromagnetic fields emanating from inner conductors 102. This blocking reduces crosstalk between adjacent conductive yarn structures and improves signal integrity. An AC signal source 304 may be connected to one or both of inner conductive yarns 102 of the coaxial conductive yarns structures. The AC signal source may be any suitable signal source, depending on the particular application. A plurality of nonconductive fibers 306 may be included in the fabric along with coaxial conductive yarn structures 100. In one example, nonconductive fibers 306 comprise nylon yarns.

In operation, AC signal source 304 applies a signal to inner conductive yarn 102. Electromagnetic fields emanate from inner conductive yarns 102. However, grounded outer conductive yarns 106 block these fields and thereby prevent crosstalk on adjacent lines.

In order to make a woven electrical network, such as that illustrated in FIG. 3, coaxial conductive yarn structures 100 and nonconductive fibers 306 may be fed into a loom as warp yarns, weft yarns, or both. In the illustrated example, coaxial conductive yarn structures 100 extend in a direction parallel to each other in woven electrical network 300. An example of a loom suitable for weaving coaxial conductive yarn structures 100 into a loom is an Eltex loom with Staubli Jacquard heads.

Figure 4:
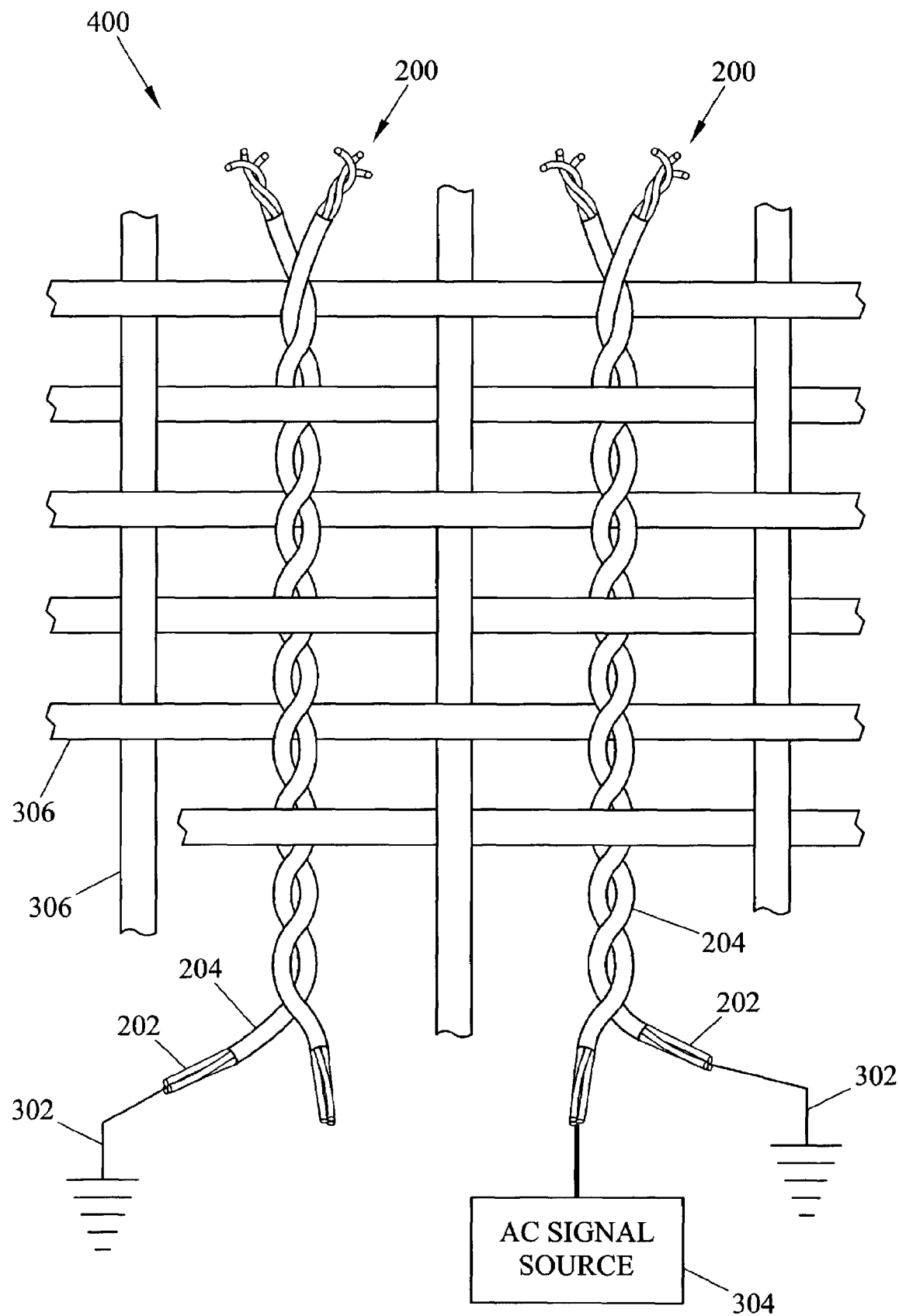
FIG. 4 is a top view of a fabric-based electrical network including first and second twisted pair conductive yarn structures according to an embodiment of the present invention.

FIG. 4 illustrates yet another example of a woven electrical network including conductive yarn structures designed to reduce crosstalk between adjacent lines and to improve signal integrity. In FIG. 4, twisted pair conductive yarn structures 200 are woven into a fabric to form a woven electrical network 400. For example, twisted pair conductive yarn structures 200 may be woven into the fabric as warp yarns, weft yarns, or both. In the illustrated example, twisted pair conductive yarn structures 200 extend in a direction parallel to each other in woven electrical network 400. Woven electrical network 400 may be made by feeding twisted pair conductive yarn structures and nonconductive fibers 306 into any suitable loom such as a Jacquard loom, as described above.

In one mode of operation of the twisted pair conductive yarn structures 200 in woven electrical network 400, one conductor 202 of each twisted pair conductive yarn structure is connected to ground 302. The other conductor 202 of at least one of the twisted pair conductive yarn structures is connected to an AC signal source 304. Connections between conductors 202 and ground and signal source 304 may be made using welding, as described in the above-referenced commonly-assigned co-pending U.S. patent application. In operation, when AC signal source 304 applies an AC signal to conductor 202, the grounded conductors block electromagnetic fields emanating from signal-carrying conductor 202. As a result, crosstalk between twisted pair conductive yarn structures 200 is reduced. In another mode of operation of the twisted pair threads, the two conductive threads 202 are oppositely driven by an AC signal source. Driving conductive threads of a twisted pair structure with equal but opposite AC signals results in common mode noise rejection. Either mode of operation is intended to be within the scope of the invention.

Although the examples in FIGS. 3 and 4 illustrate coaxial and twisted pair conductive yarn structures in separate fabrics, it is understood that these structures can be incorporated into the same fabric. Any suitable combination of coaxial and twisted pair conductive yarn structures is intended to be within the scope of the invention.

Fabric Structures to Improve Signal Integrity Leno Weave Structures

In addition to the coaxial and twisted pair conductive yarn structures described above, the present invention may also include fabric structures in which both coaxial and twisted pair structures can be formed while a fabric is being knitted or woven. Forming coaxial and twisted pair structures as a fabric is being knitted or woven improves manufacturing efficiency in making fabric-based signal transmission systems and facilitates creation of floats for electrical device connection and disconnection and for electrical device attachment.

Figure 5:
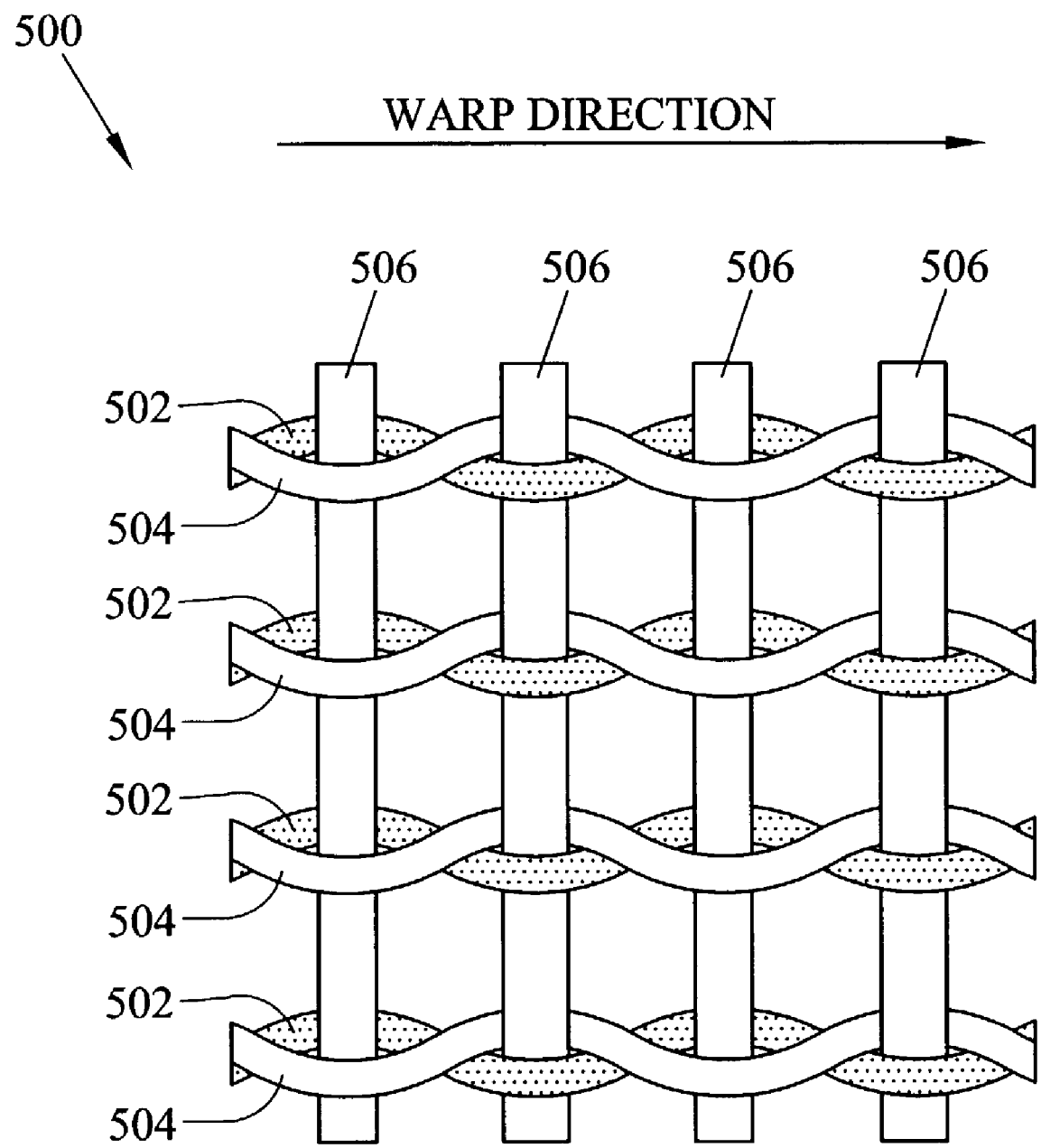
FIG. 5 is a top view of a fabric-based signal transmission system in which conductive yarn structures are woven as warp threads into a fabric and twisted around consecutive weft threads to form a spiral pair according to an embodiment of the present invention.

FIG. 5 illustrates an example of a fabric-based signal transmission system 500 in which twisted pair structures can be formed while the fabric is being woven according to an embodiment of the present invention. Referring to FIG. 5, a plurality of warp threads 502 and 504 are twisted around consecutive weft threads 506. This type of configuration is referred to in the textiles industry as a leno weave. A leno weave involves pair-wise crossing of adjacent warp threads in a woven fabric. A leno weave is a form of plain weave in which adjacent warp threads are twisted around consecutive weft threads to form a spiral pair, effectively locking each weft in place. According to the present invention, warp threads 502 and 504 are preferably insulated conductive threads or yarns. Leno weaving conductive warp threads in the manner shown in FIG. 5 produces twisted pair conductive yarn structures, which exhibit common mode noise rejection when threads 502 and 504 are oppositely driven by an AC signal source. In another mode of operation of the fabric-based signal transmission system 500 containing leno-woven twisted pair conductive yarn structures, one conductor 502 of each leno-woven twisted pair conductive yarn structure is connected to ground. The other conductor 504 of at least one of the leno-woven twisted pair conductive yarn structures is connected to an AC signal source.

According to an important aspect of the invention, the twisted pair yarn structures formed by threads 502 and 504 can be accomplished during the weaving process by the use of leno headles, which allows control of individual warp yarns. In FIG. 5, warp threads 502 and 504 cross nonconductive threads 506 on alternating sides. However, the present invention is not limited to forming twisted pair conductive yarn structures using only this type of leno weave. Any suitable leno weave in which twisted pair or coaxial structures can be formed while a fabric is being woven is intended to be within the scope of the invention.

Figure 6:
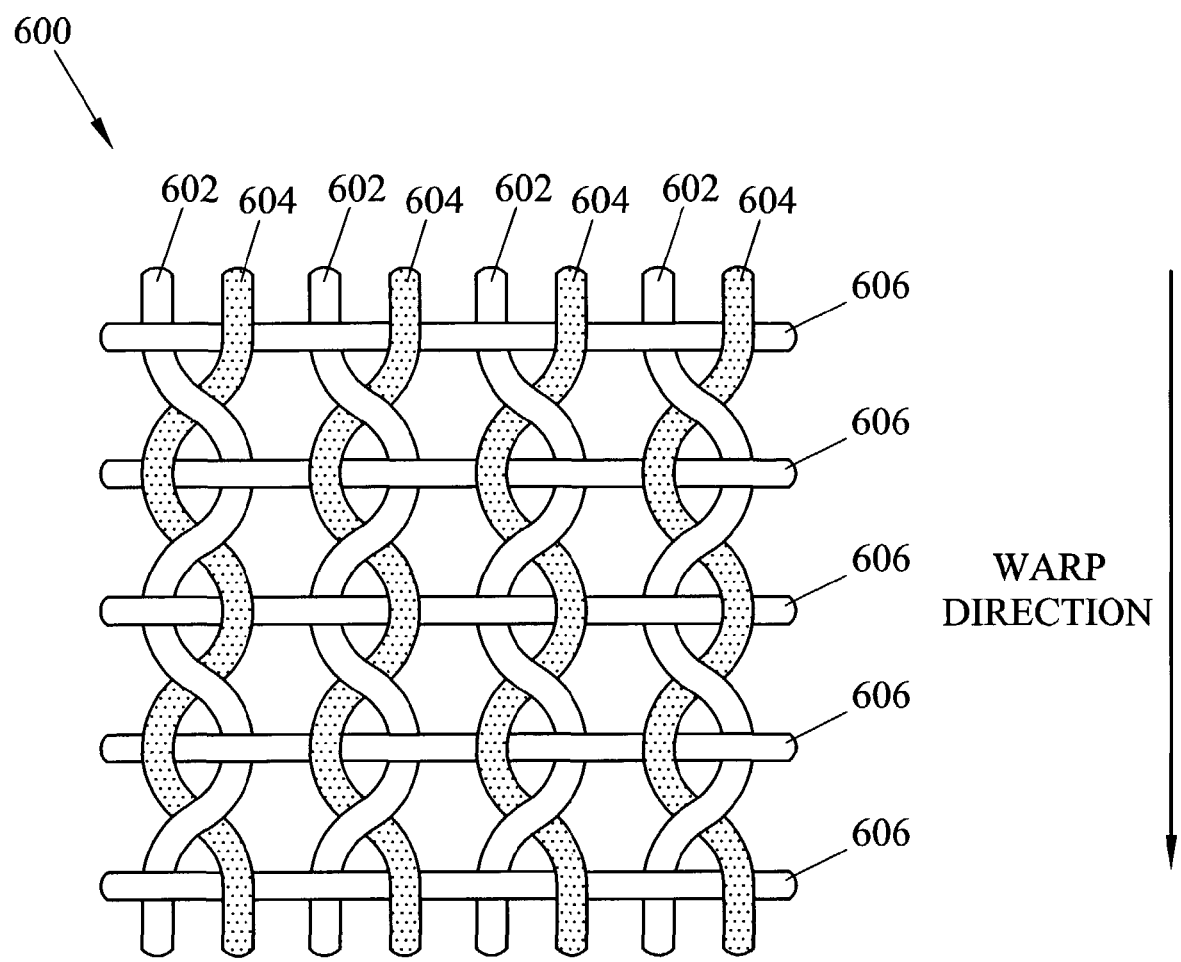
FIG. 6 is a top view of a fabric-based signal transmission system in which a bottom doup warp thread goes over consecutive weft threads and crosses adjacent warp threads between two weft threads according to embodiment of the present invention.

FIG. 6 illustrates a fabric-based signal transmission system 600 in which twisted pair structures are formed using a bottom doup leno weave. In a bottom doup leno weave, the doup warp thread goes over consecutive weft threads and crosses below the adjacent warp thread between two weft threads. In FIG. 6, threads 602 and 604 are preferably insulated conductors. Threads 606 may be conductive or nonconductive. If threads 606 are conductive, they are preferably insulated. In the configuration illustrated in FIG. 6, thread 604 is the doup warp thread that passes over consecutive weft threads 606 and below warp thread 602 between adjacent weft threads 606. By using a bottom doup leno weave, the twisted pair structures can be formed by conductors 602 and 604 at the same time conductors 602 and 604 are being woven into a fabric. As stated above, this increases the efficiency with which fabric-based signal transmission systems with improved signal integrity characteristics can be manufactured.

The present invention is not limited to forming twisted pair and coaxial structures using a bottom doup leno weave. In an alternate embodiment of the invention, the twisted pair structures can be formed using a top doup leno weave. In case of top doups, the doup warp thread goes below consecutive weft threads and crosses above the adjacent warp thread (the ground threads) in between two weft threads. Twisted pair and coaxial structures of the present invention can also be formed with the doup thread going above and below the consecutive weft threads but always being above the adjacent warp threads in order to form a spiral pair, as illustrated in FIG. 5. In addition, the fabric-based signal transmission systems of the present invention that are made using a leno weave can be combined with other weaving techniques to from a wearable garment with one or more electrical circuits.

It should be noted that in the twisted pair structures described herein, one conductor may be connected to an AC or DC signal source and the other conductor may be grounded, similar to a coaxial signal transmission system in which the inner conductor carries a signal and the outer conductor is grounded. In an alternate mode of operation, the conductors in a twisted pair structure may be oppositely driven by an AC signal source. Either mode of operation is intended to be within the scope of the invention.

Figure 7:
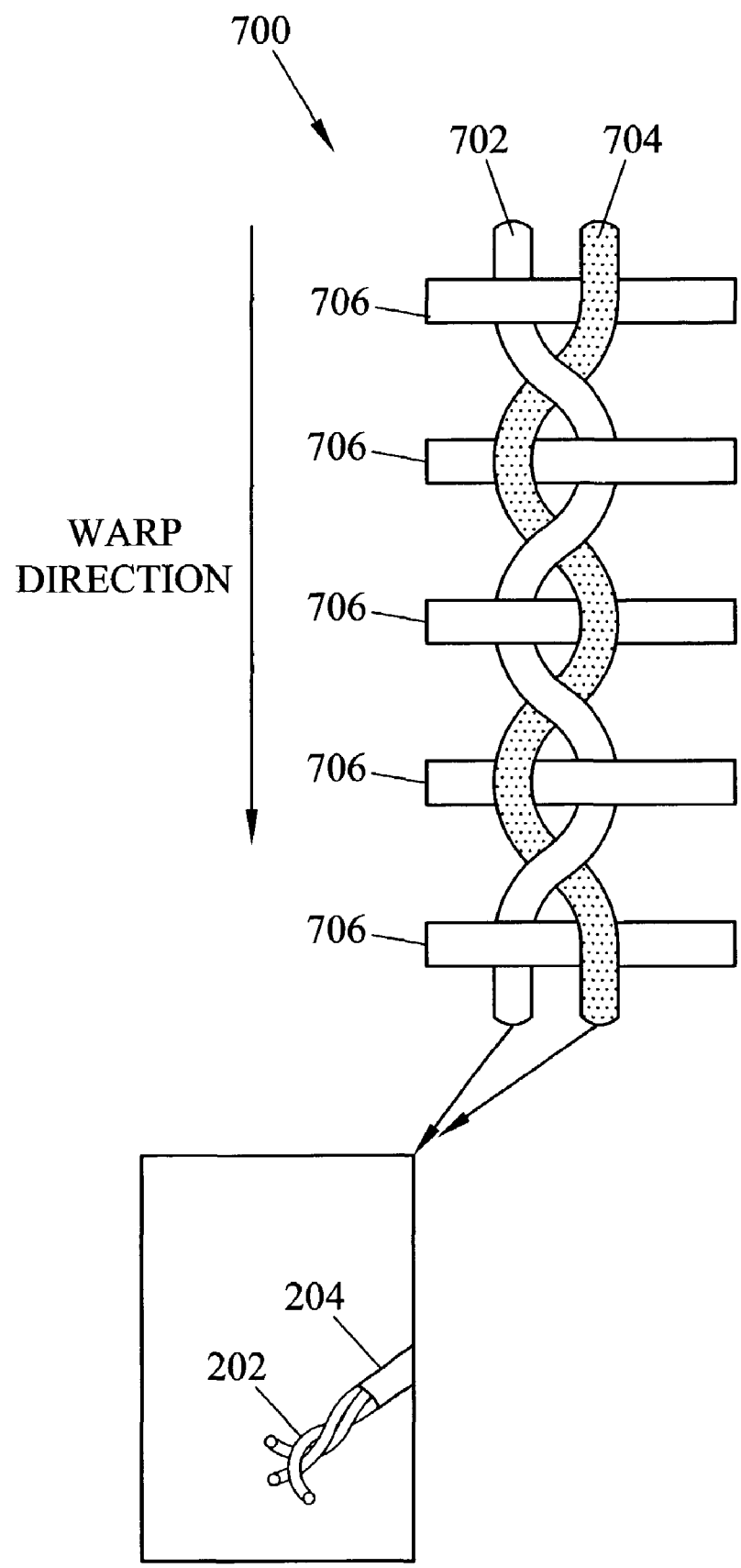
FIG. 7 is a top view of a fabric-based signal transmission system in which insulated conductive yarns are woven in a leno weave to form a twisted pair configuration according to an embodiment of the present invention.

In the leno-woven twisted pair structures described herein, either or both of the conductive threads that form the twisted pair structure may be insulated conductive yarns, as illustrated in FIG. 2. FIG. 7 illustrates this concept. In FIG. 7, a fabric-based signal transmission system 700 includes insulated conductive threads 702 and 704 being leno woven into a fabric with weft threads 706, which may be conductive (preferably insulated conductive threads especially if either one of threads 702 or 704 is not insulated) or nonconductive. Each thread 702 and 704 may include a plurality of inner conductive strands being twisted together to form a conductive yarn 202 and may be coated with an outer insulating layer 204.

Figure 8:
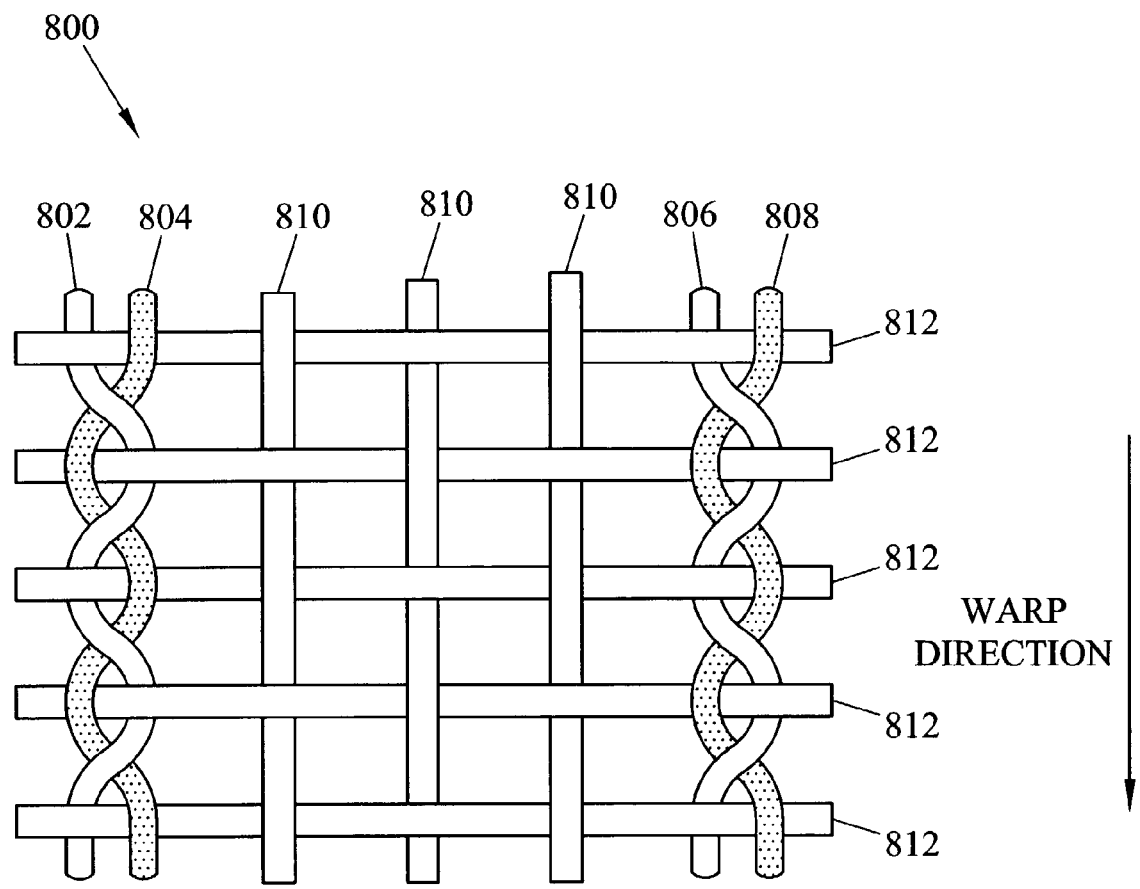
FIG. 8 is a top view of a fabric-based signal transmission system in which conductive threads are woven in a leno weave to form twisted pair configurations separated by nonconductive fibers being plain woven into a fabric according to an embodiment of the present invention.

As stated above, the leno weaving may be combined with other types of weaving techniques to form a garment incorporating one or more electrical circuits. FIG. 8 illustrates a fabric-based signal transmission system 800 where twisted pair structures are leno woven in a fabric, and the fabric includes a plain woven portion. In FIG. 8, threads 802 and 804 are preferably insulated conductive threads, as described above. Threads 810 and 812 may be conductive or nonconductive. In the illustrated example, threads 802 and 804 are leno-woven into the fabric and form a twisted pair structure. Similarly, threads 806 and 808 are leno-woven into the fabric to form an additional twisted pair structure. However, threads 810 are plain woven into the fabric. Such a combination weave may be formed on a Jacquard loom where threads are individually addressable.

Figure 9:
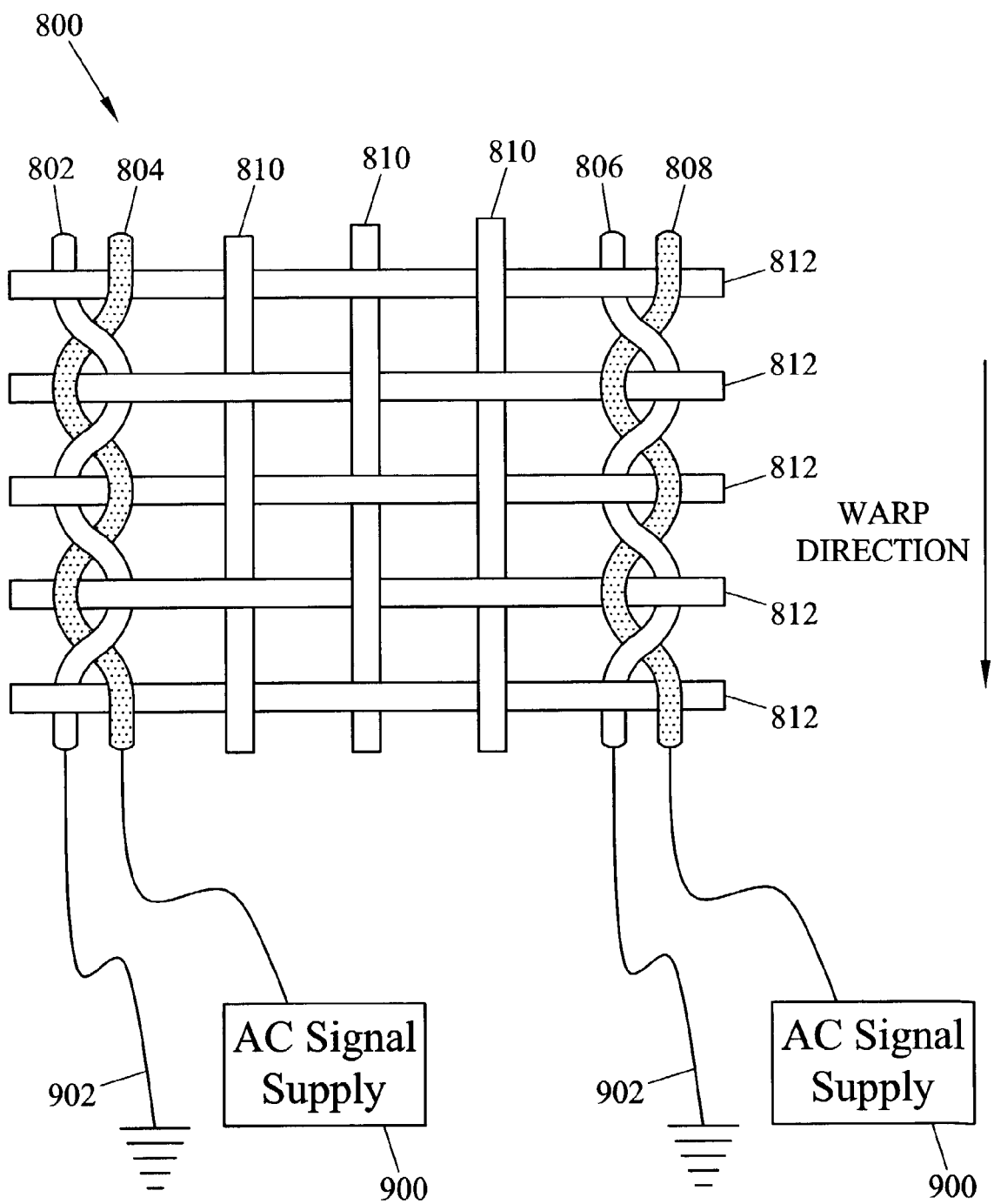
FIG. 9 is a top view of a fabric-based signal transmission system in which one thread of a conductive warp thread twisted pair is connected to an AC signal source and the other thread is connected to ground according to an embodiment of the present invention.

As stated above, in one mode of operation, one insulated conductive thread forming the spiral pair of a leno weave may be connected to ground and the other conductive thread may be connected to a signal source, such as an AC signal source. FIG. 9 illustrates this mode of operation. In FIG. 9, conductive threads 804 and 808 are connected to AC signal supplies 900 and conductive threads 802 and 806 are connected to ground 902. In this arrangement, AC signal crosstalk between conductive threads 804 and 808 is significantly reduced. As a result, using this configuration, the density of fabric-based signal transmission systems can be increased, which increases the functionality that can be provided by fabric-based electrical circuits. In addition, because the twisted pair structure is formed using a leno weave, rather than separately weaving the twisted pair structure and then weaving the twisted pair structure into the fabric, manufacturing time is reduced.

Figure 10:
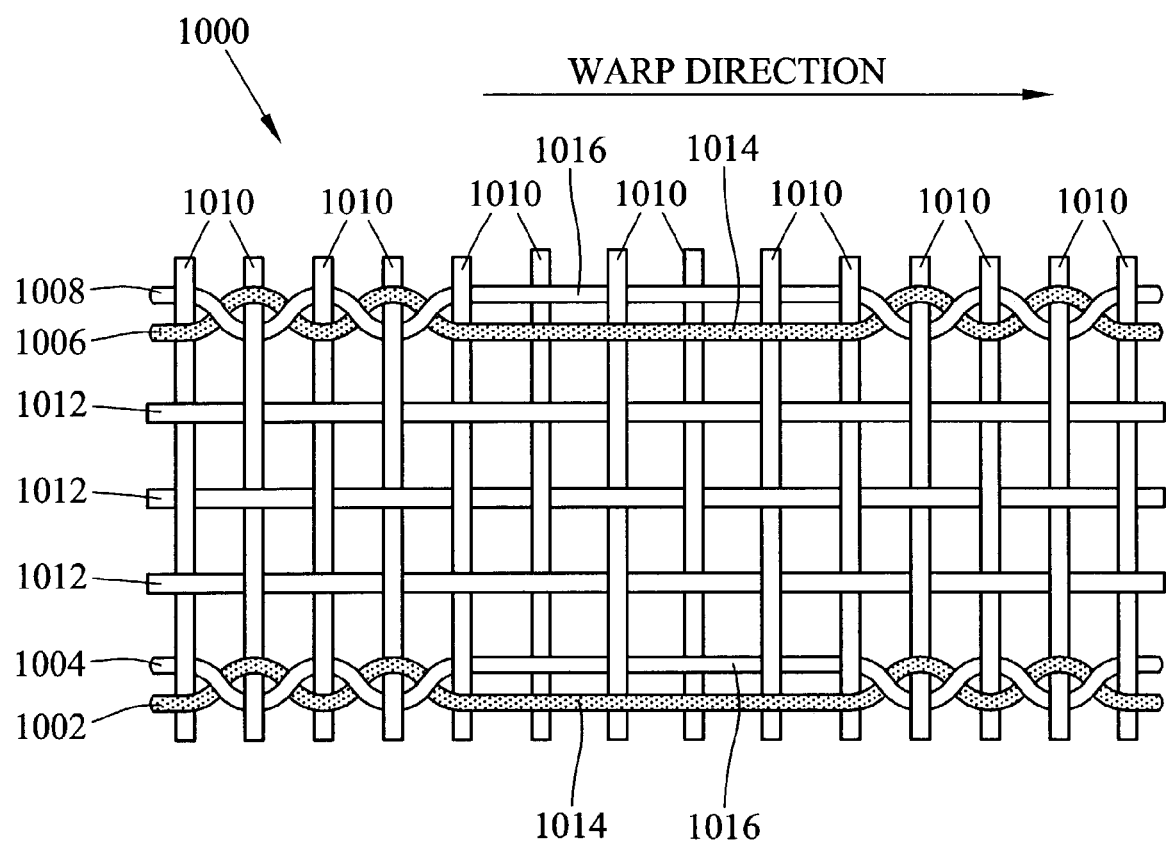
FIG. 10 is a top view of a fabric-based signal transmission system in which insulated conductive threads are woven in a leno weave to form twisted pair like structures and wherein the threads include floats and/or woven portions to facilitate electrical connection and disconnection or electrical device attachment.

Another advantage of forming twisted pair structures while weaving a fabric is that the twisting of the conductive threads can be controlled to form floats in regions of the fabric to facilitate electrical connection and disconnection and also electrical device attachment. FIG. 10 illustrates an example of a fabric-based signal transmission system 1000 including floats according to an embodiment of the present invention. In FIG. 10, threads 1002-1008 are preferably insulated conductive threads, as described above. Threads 1010 and 1012 may be conductive or nonconductive. Threads 1006 and 1008 are leno-woven into the fabric to form a twisted pair structure. Similarly, threads 1002 and 1004 are leno-woven into the fabric to form an additional twisted pair structure. Threads 1002 and 1006 each include a floating region 1014 to facilitate electrical connection and disconnection and also to facilitate electrical device attachment. Threads 1004 and 1008 each include a plain-woven region 1016, rather than a floating region, so that the threads can be separately identified when making electrical connections and disconnections. Threads 1004 and 1008 may also each include a floating region 1014 to facilitate electrical connection and disconnection and also to facilitate electrical device attachment.

Figure 11:
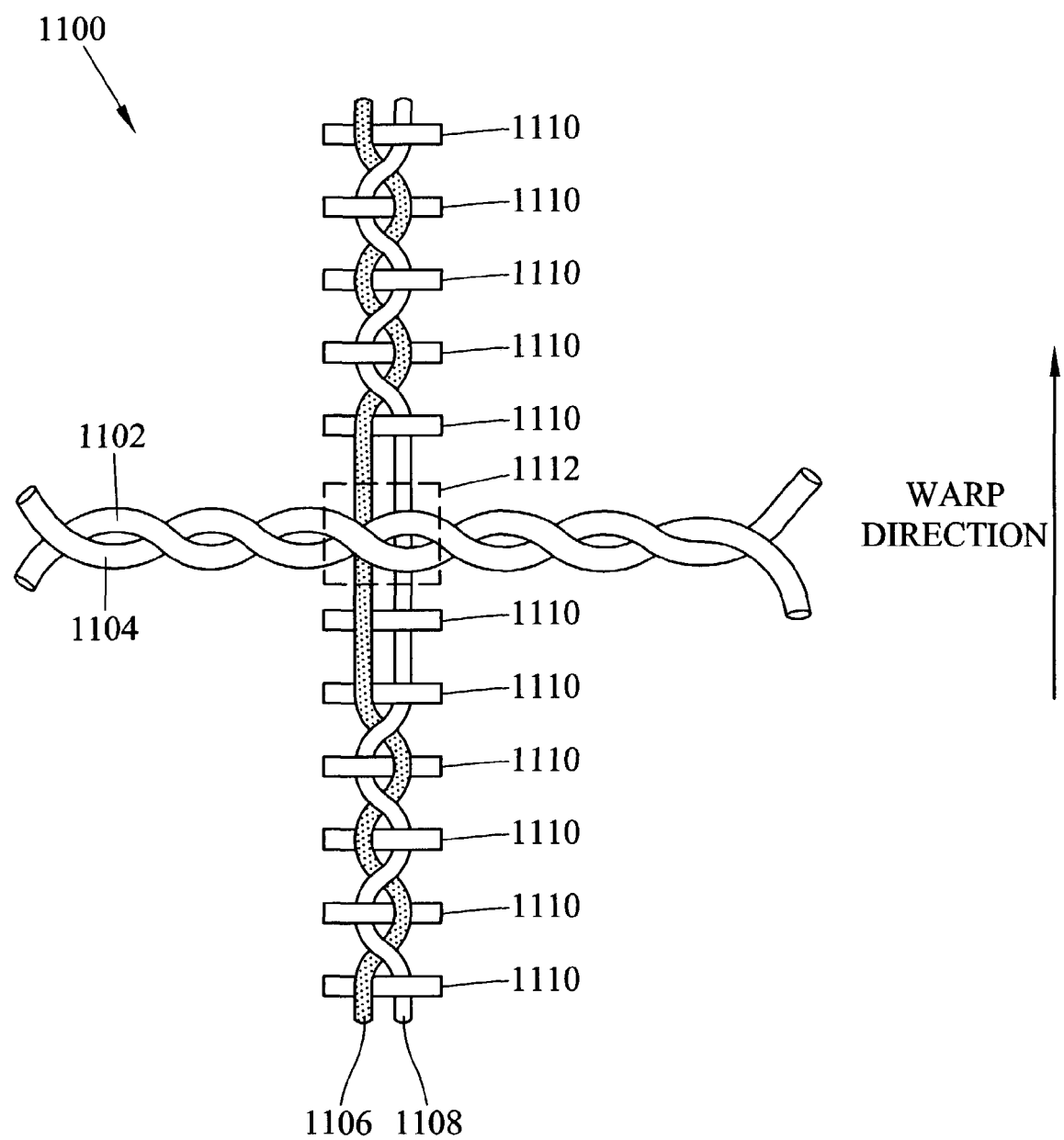
FIG. 11 is a top view of a fabric-based signal transmission system illustrating a crossover point between a leno woven twisted pair structure in the warp direction and a woven or floating twisted pair structure in the weft direction according to an embodiment of the present invention.

As mentioned above, electrical connection in a fabric-based signal transmission system may be performed by welding conductive threads at crossover points, which may correspond to floats. Electrical disconnection may be effected by cutting conductive threads at the floats. FIG. 11 illustrates a signal transmission system 1100 including a crossover point at which electrical connection or disconnection can be made. In FIG. 11, threads 1102-1108 are assumed to be insulated conductors. Threads 1110 may be conductive or nonconductive. Conductive threads 1102 and 1104 may be a pre-formed twisted pair structure. In contrast, conductive threads 1106 and 1108 are a twisted pair structure that was created while conductive threads 1110 were being leno woven into the fabric. It can be seen that conductive threads 1102 and 1104 intersect conductive threads 1106 and 1108 at a crossover point 1112. By selectively dissolving the insulating layers on the conductive threads and welding conductors together, electrical connection between orthogonal conductive threads can be achieved. In addition, it may be desirable to weld all of the crossover points in a fabric. In such an example, electrical circuits can be created by selectively disconnecting by cutting floats on appropriate sides of the crossover points.

Figure 12:
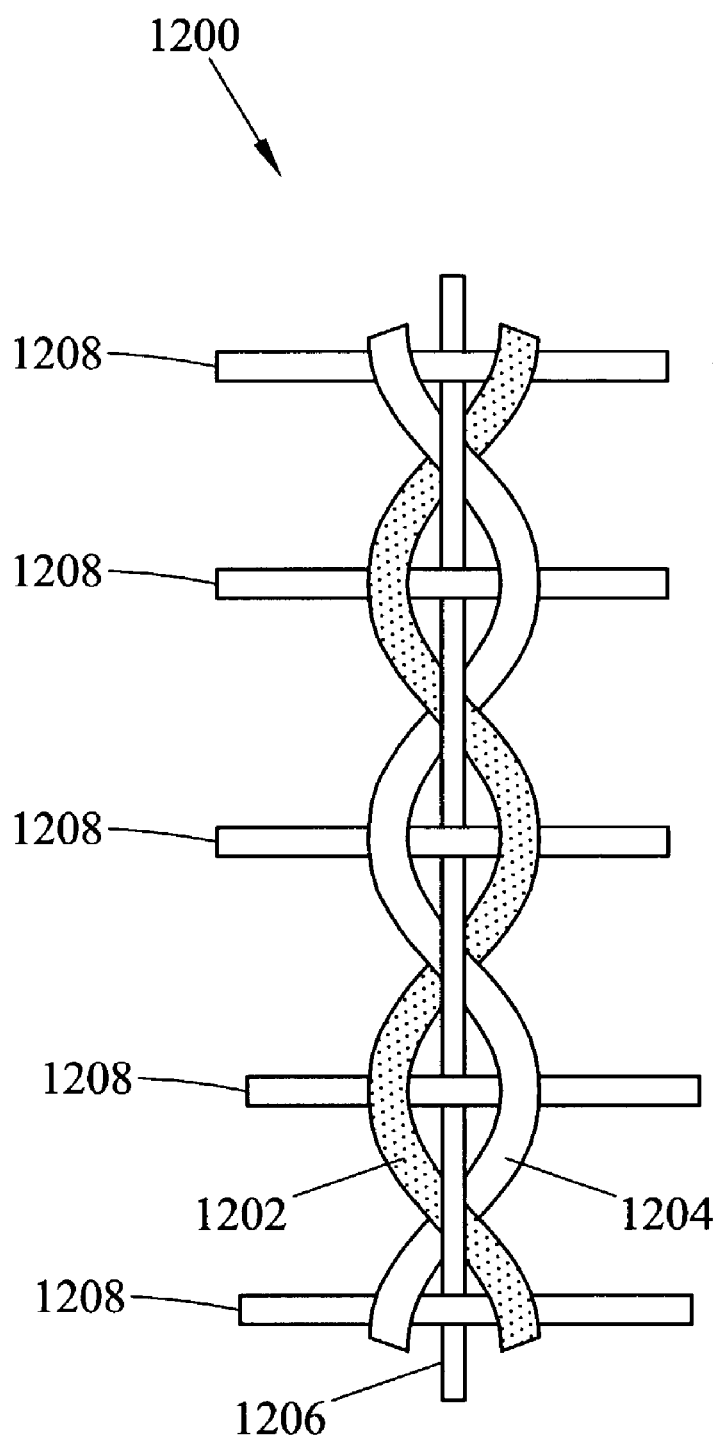
FIG. 12 is a top view of a fabric-based signal transmission system in which conductive threads are leno woven into a fabric to form a coaxial structure according to an embodiment of the present invention.

In addition to producing signal transmission systems with twisted pair structures simultaneously with weaving conductive threads into a fabric, coaxial structures can also be produced while weaving conductive threads into a fabric. FIG. 12 illustrates an example of a coaxial structure that can be produced while weaving conductive threads into a fabric according to an embodiment of the present invention. In FIG. 12, a fabric-based signal transmission system 1200 includes insulated conductive threads 1202, 1204, and 1206 and threads 1208, which may be conductive or nonconductive. Conductive threads 1202, 1204, and 1206 are leno-woven into the fabric to form a coaxial structure. This structure can be formed at the time threads 1202, 1204, and 1206 are being woven into the fabric by using a Jacquard loom equipped with leno headles. Because the coaxial structure can be formed at the time the fabric is created, the time and cost required to manufacture garments including coaxial structures is reduced. In addition, as described above, forming the coaxial structures at weaving time facilitates production of floating regions for electrical connection and disconnection and also electrical device attachment.

In operation, conductor 1206 may be connected to an AC signal source and conductors 1202 and 1204 may be connected to ground. Connecting conductors 1202 and 1204 to ground reduces the likelihood that external electromagnetic interference will affect the signal on conductor 1206. Connecting conductors 1202 and 1204 to ground also reduces the likelihood that the signal on conductor 1206 will adversely affect signals on other conductors. As a result, signal conductors can be placed close to each other in a fabric and component density can be increased.

Figure 13:
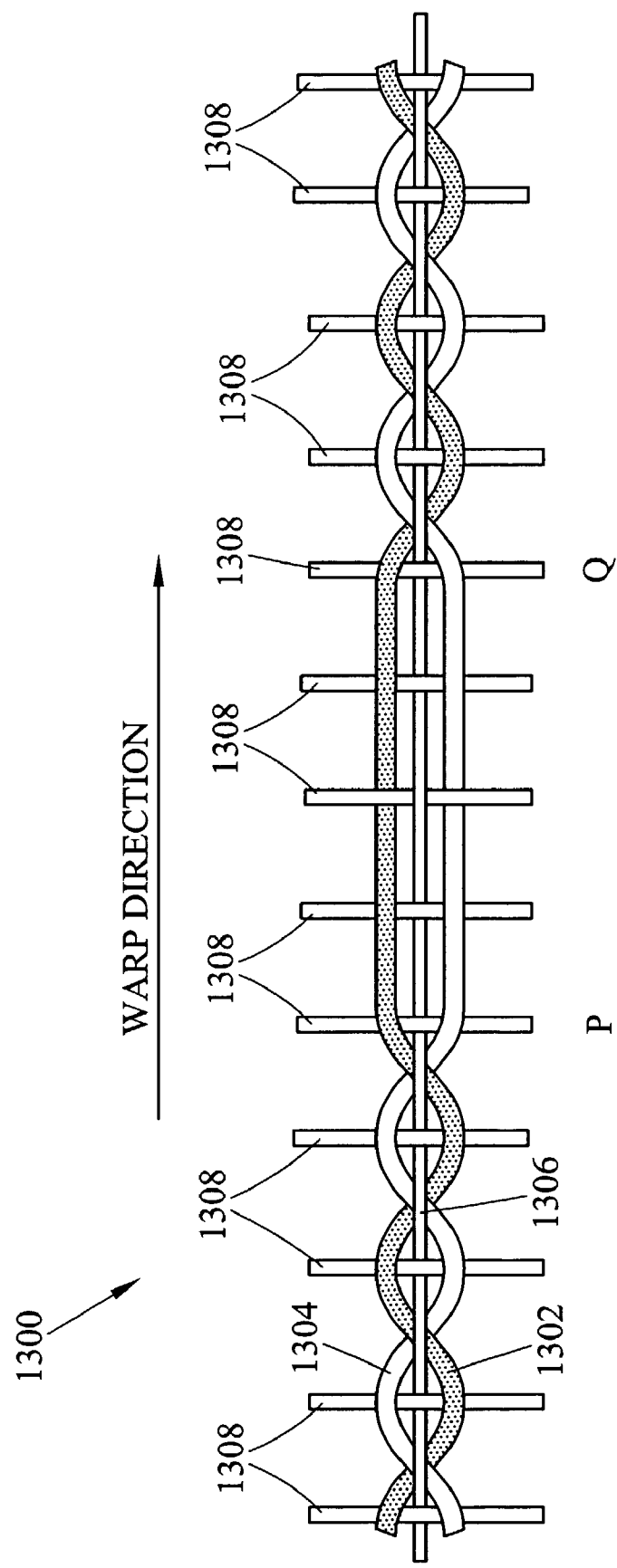
FIG. 13 is a top view of a fabric-based signal transmission system in which conductive threads are leno woven into a fabric to form a coaxial structure and in which the threads include floating portions or woven portions to facilitate electrical device attachment or to facilitate electrical connection and disconnection according to an embodiment of the present invention.

As with the twisted pair structures described above, floats can be formed in coaxial structures to facilitate electrical connection and disconnection. FIG. 13 illustrates an example of a coaxial structure with floats according to an embodiment of the present invention. In FIG. 13, a fabric-based signal transmission system 1300 includes insulated conductive threads 1302, 1304, and 1306, which are leno woven in the fabric to form a coaxial structure. Threads 1308 are woven in the fabric in the weft direction and may be conductive or nonconductive. In region PQ, the twisting of threads 1302, 1304, and 1306 is preferably stopped so that the threads run parallel to each other to form floats. These parallel floats may be used for selective electrical connection and disconnection with orthogonal threads at crossover points or for electrical device attachment, in the manner described above.

Knitted Structures

Figure 14:
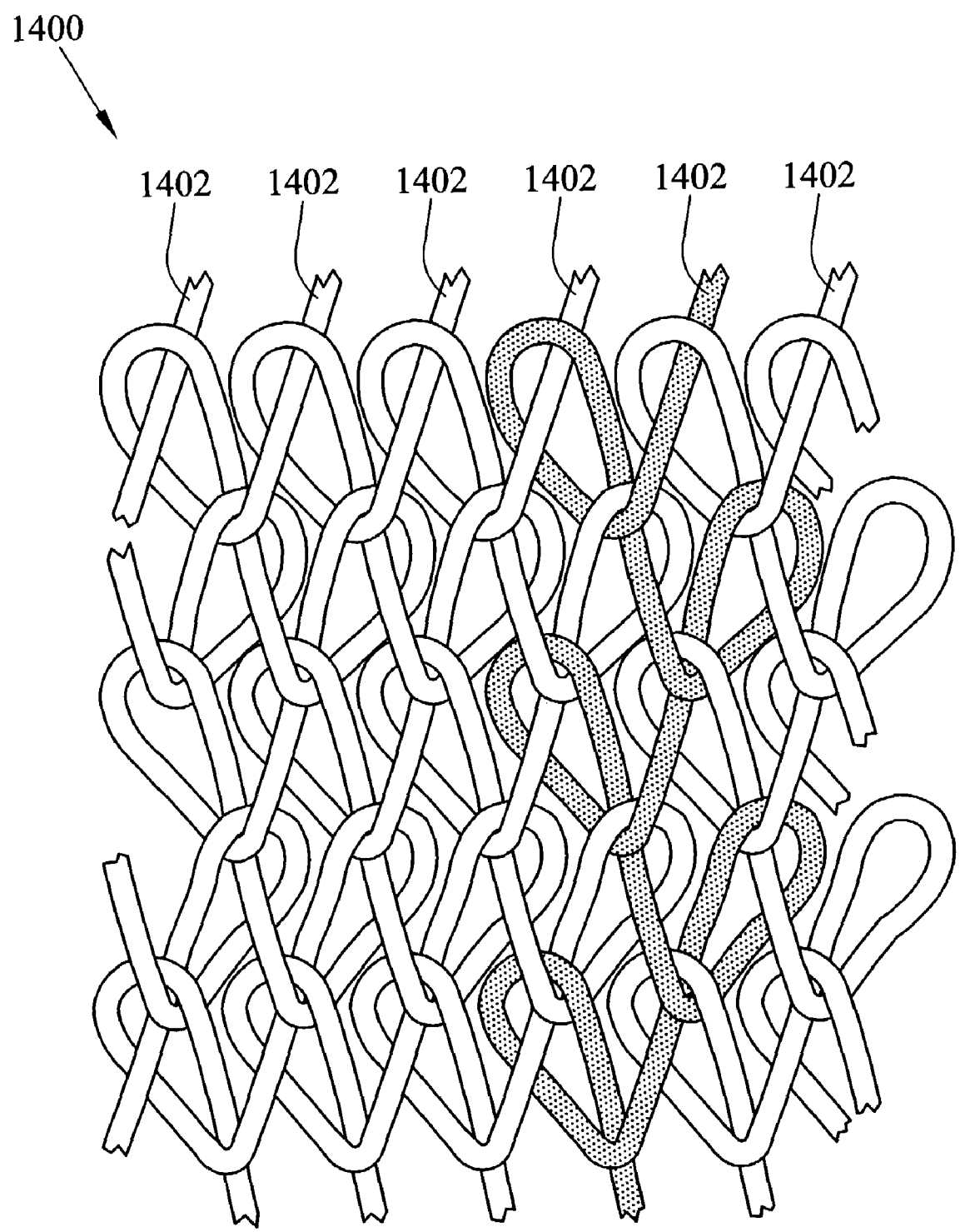
FIG. 14 is a top view of a warp knitted fabric structure.

In addition to coaxial and twisted pair structures formed simultaneously with weaving a fabric, the present invention also includes coaxial and twisted pair structures formed simultaneously with knitting a fabric. Such structures can be produced on knitting machines using any of the knitting processes (for example, warp knitting or weft knitting). In warp knitting, lateral translation of any thread is possible and this can be used for the formation of twisted pair and coaxial structures on the knitting machine itself. Warp knitting consists of threads passing up the length of the fabric, with each thread intersecting with the thread on each side as shown in FIG. 14. In FIG. 14, a warp-knitted fabric 1400 includes warp knitted threads 1402. One of the threads 1402 is highlighted to illustrate its interconnection with neighboring threads. This fabric has the same appearance on each side, does not ladder, and is difficult to unravel.

Figure 15:
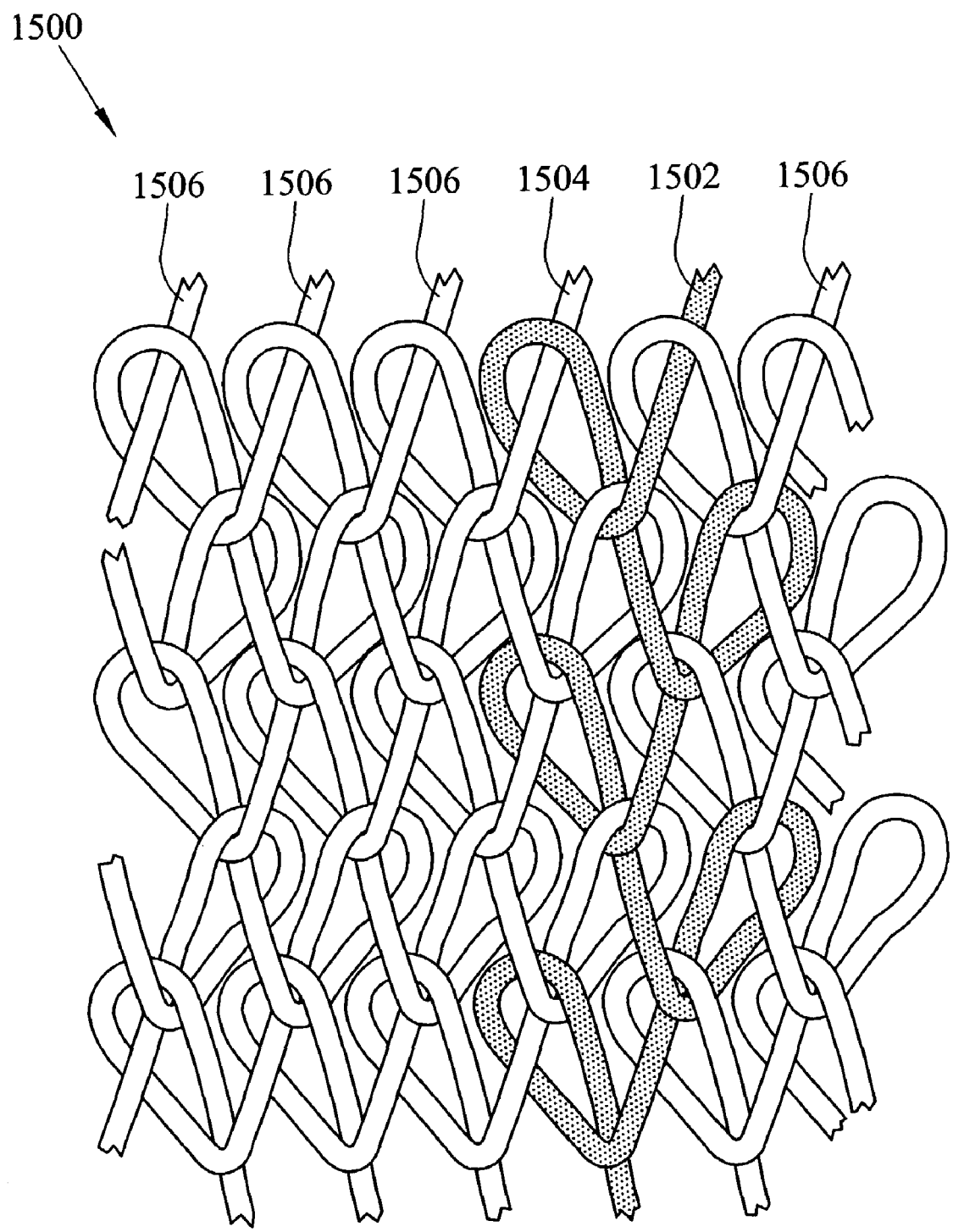
FIG. 15 is a top view of fabric-based signal transmission system in which conductive threads are warp knitted into a fabric to form a twisted pair structure according to an embodiment of the present invention.

FIG. 15 illustrates an example of a twisted pair structure formed using warp knitting according to an embodiment of the present invention. In FIG. 15, a fabric-based signal transmission system 1500 includes warp knitted threads 1502, 1504, and 1506. Threads 1502 and 1504 may be insulated conductive threads. Threads 1506 may be conductive or nonconductive. Threads 1502 and 1504 are warp knitted to each other to form a twisted pair structure. In operation, thread 1502 may be connected to a signal source and thread 1504 may be connected to ground or vice-versa. In another mode of operation, threads 1502 and 1504 may be oppositely driven by an AC signal source. Connecting one of the conductive threads to ground and the other thread to a signal source improves signal integrity in a fabric-based electrical network because the ground conductor blocks electromagnetic field lines emanating from signal conductors. Driving conductive threads of a twisted pair structure with equal but opposite AC signals results in common mode noise rejection. Either mode of operation is intended to be within the scope of the invention.

Figure 16:
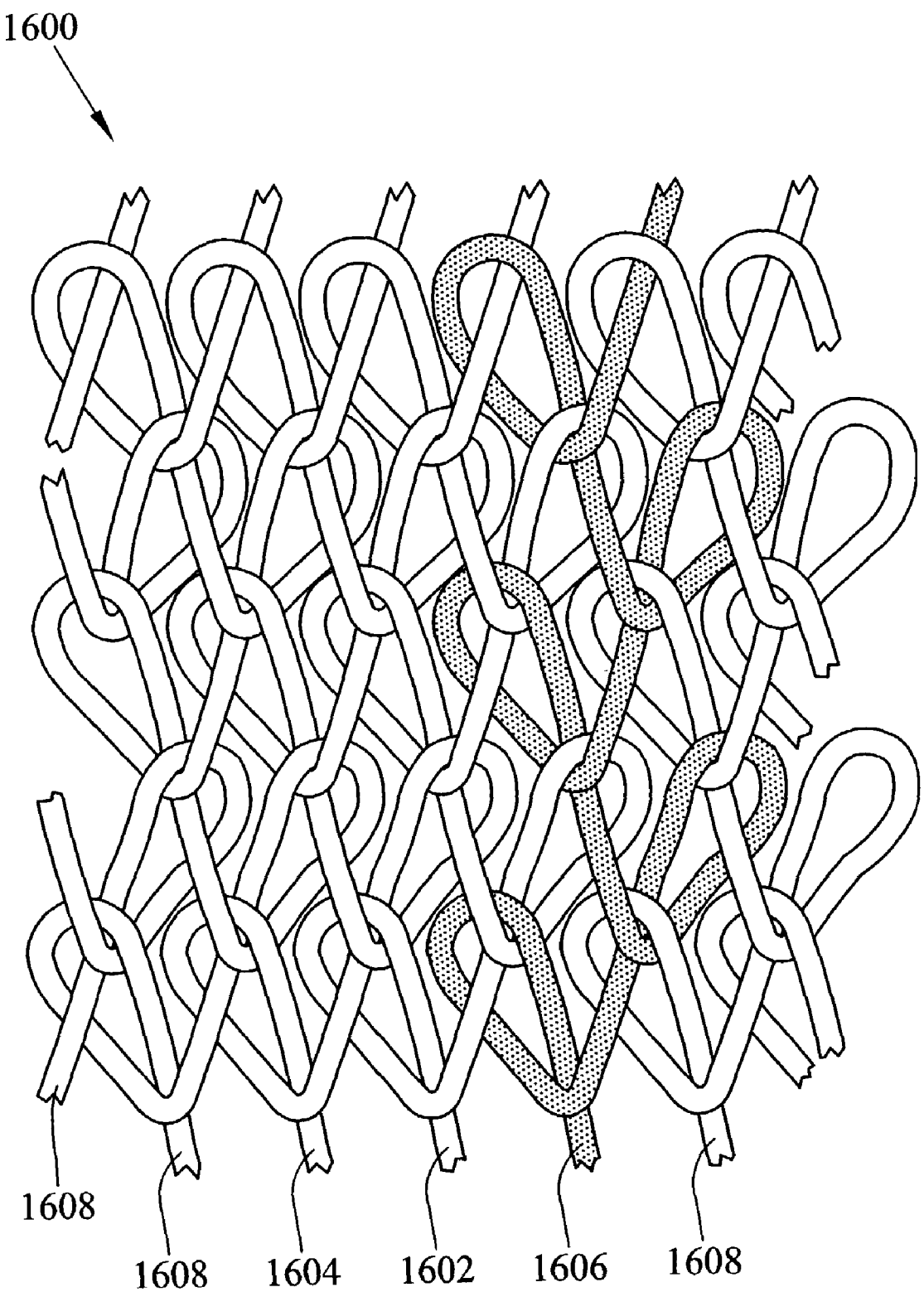
FIG. 16 is a top view of a fabric-based signal transmission system in which conductive threads are warp knitted into a fabric to form a coaxial structure according to an embodiment of the present invention.

In addition to twisted pair structures, coaxial structures can also be formed while the threads that form the coaxial structures are being warp knitted into a fabric. FIG. 16 illustrates an example of a warp knitted fabric-based signal transmission system including a coaxial structure according to an embodiment of the present invention. Referring to FIG. 16, a warp-knitted fabric-based signal transmission system 1600 includes insulated conductive threads 1602, 1604, and 1606 being warp knitted to each other to form a coaxial structure and threads 1608, which may be conductive or nonconductive. In operation, thread 1602 may be connected to an AC signal source and threads 1604 and 1606 may be connected to ground. Because grounded threads 1604 and 1606 surround conductive thread 1602, electric fields produced by other conductors will have a reduced effect on signals on thread 1602. Similarly, electric fields produced by thread 1602 will have a reduced effect on signals on other signal carrying conductors. As a result, signal-carrying conductors can be placed closer to each other in a fabric-based signal transmission system, increasing the potential device density and thereby increasing the functionality of garments incorporating such devices.

Figure 17:
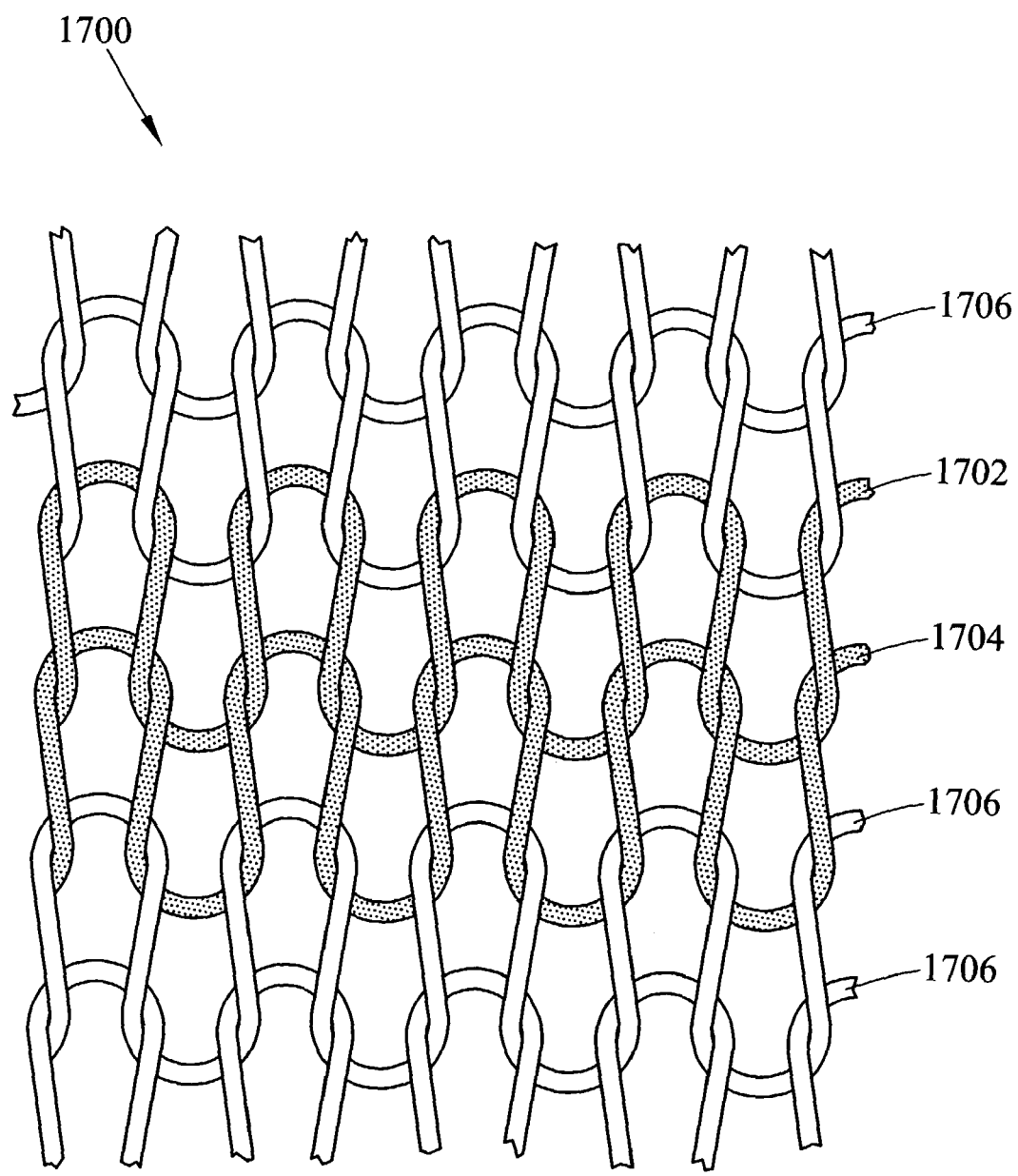
FIG. 17 is a top view of a fabric-based signal transmission system in which conductive threads are weft knitted into a fabric to form a twisted pair structure according to an embodiment of the present invention.

Weft Knitting can also be used to form twisted structures. FIG. 17 illustrates an example of a twisted pair structure formed using weft knitting according to an embodiment of the present invention. Referring to FIG. 17, a weft-knitted fabric-based signal transmission system 1700 includes insulated conductive threads 1702 and 1704 being weft knitted to each other to form a twisted pair structure. Conductive threads 1702 and 1704 are also weft-knitted to threads 1706, which may be conductive or nonconductive. The twisted pair structure formed by weft knitted threads 1702 and 1704 may be formed on a knitting machine at the time the fabric is created—thus decreasing the time to incorporate such structures into a fabric over techniques that require the twisted pair structure to be formed in advance of incorporating the structure into a fabric.

In one exemplary mode of operation, thread 1702 may be connected to a signal source and thread 1704 may be connected to ground, or vice-versa. In this mode of operation, thread 1704 blocks electromagnetic fields emanating from signal carrying thread 1702 from adversely affecting signals on other conductors. In addition, ground thread 1704 reduces the effect of electromagnetic fields from other conductors on the signal on signal carrying thread 1702. In an alternate mode of operation, threads 1702 and 1704 may be oppositely driven by and AC signal source. In this mode of operation, noise common to both threads (common-mode noise) may be rejected.

Figure 18:
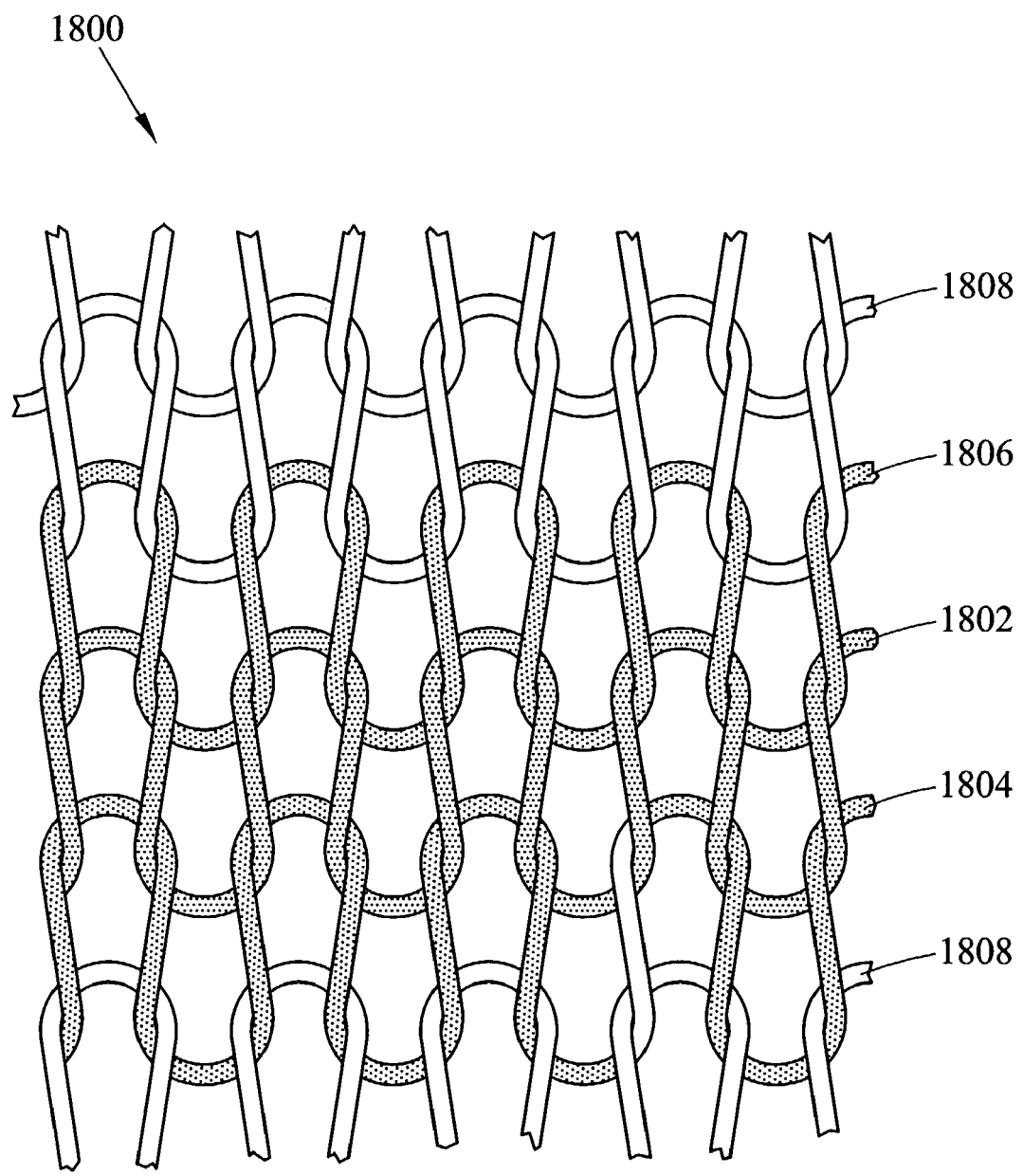
FIG. 18 is a top view of a fabric-based signal transmission system in which conductive threads are weft knitted into a fabric to form a coaxial structure according to an embodiment of the present invention.

In addition to being used to form twisted pair structures, weft knitting can also be used to form coaxial structures. FIG. 18 illustrates an example of a coaxial structure formed using weft knitting according to an embodiment of the present invention. In FIG. 18, a weft-knitted fabric-based signal transmission system 1800 includes insulated conductive threads 1802, 1804, and 1806 being weft knitted to each other to form a coaxial structure. Conductive threads 1802, 1804, and 1806 are also weft knitted to threads 1808 to form a fabric. Threads 1808 may be conductive or nonconductive. Because the coaxial structures formed by threads 1802, 1804, and 1806, can be formed at the time that the fabric is being knitted, the time required to produce garments including these structures is reduced.

In operation, thread 1802 may be connected to a signal source, and threads 1804 and 1806 may be connected to ground. Because grounded threads 1804 and 1806 block electromagnetic fields, signals on other conductors near thread 1802 will have a reduced effect on the signal on the signal on thread 1802 and vice-versa. As a result, signal-carrying conductors can be placed closer together in a garment, device density can be increased, and the functionality of fabric-based electrical circuits can also be increased.

Figure 19:
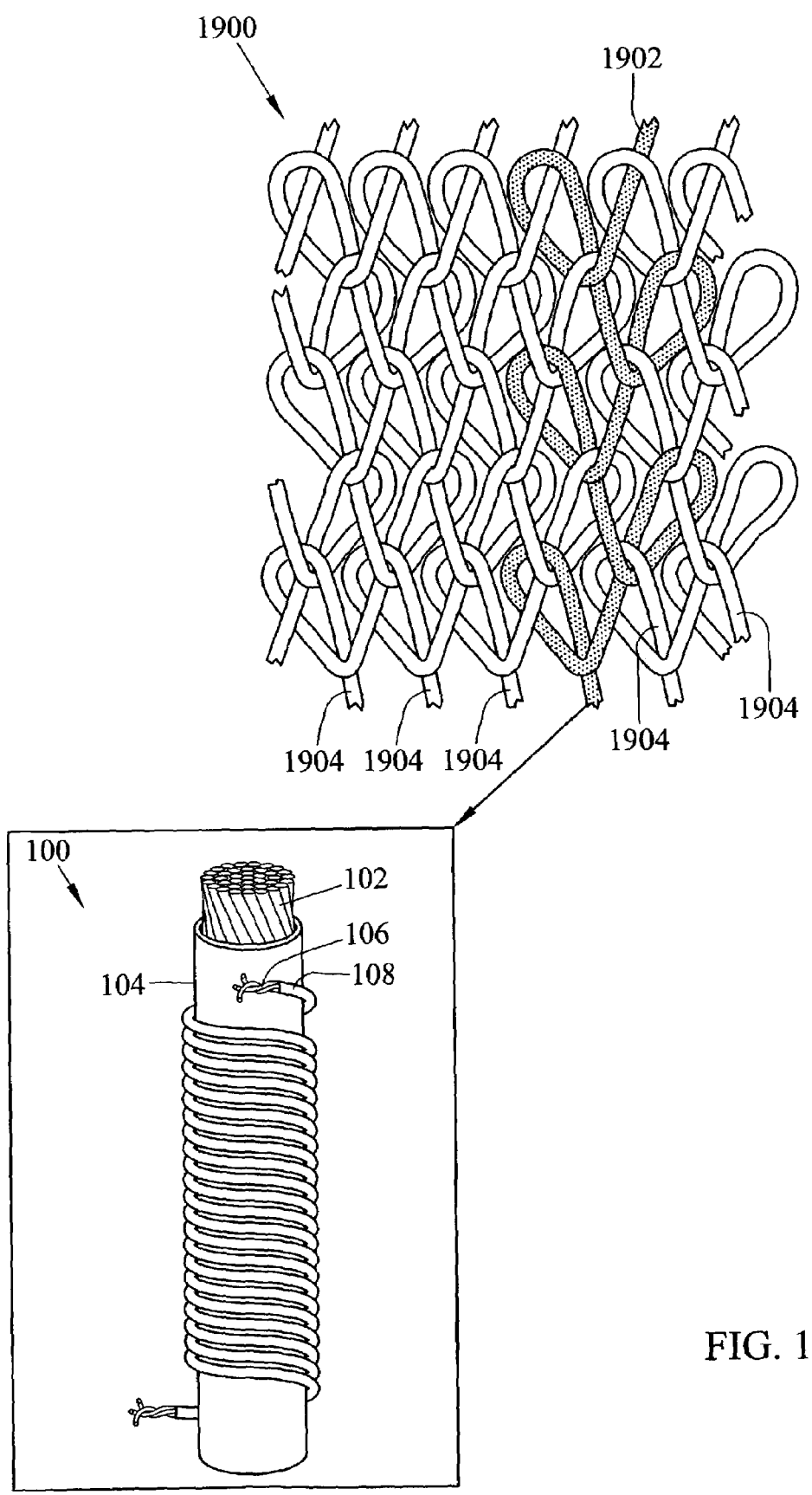
FIG. 19 is a top view of a fabric-based signal transmission system in which a coaxial conductive yarn structure is warp knitted into a fabric according to an embodiment of the present invention.

While FIGS. 3 and 4 above illustrate weaving of the coaxial and twisted pair structures illustrated in FIGS. 1 and 2 into a fabric, the coaxial and twisted pair conductive yarn structures illustrated in FIGS. 1 and 2 can be knitted into a fabric. FIG. 19 illustrates exemplary warp knitting of coaxial conductive yarn structure 100 into a fabric. In FIG. 19, a fabric-based signal transmission system 1900 includes a conductive yarn 1902 and yarns 1904, which may be conductive or nonconductive. In the illustrated example, conductive yarn 1902 may be similar in structure to coaxial conductive yarn structure 100. That is, yarn 1902 may include an inner conductor 102 having a plurality of conductive strands being twisted together, an insulating layer 104 surrounding the conductive strands, and an insulated outer conductor 106. In operation, conductor 102 may be connected to a signal source and conductor 106 may be connected to ground, resulting in improved signal integrity.

Figure 20:
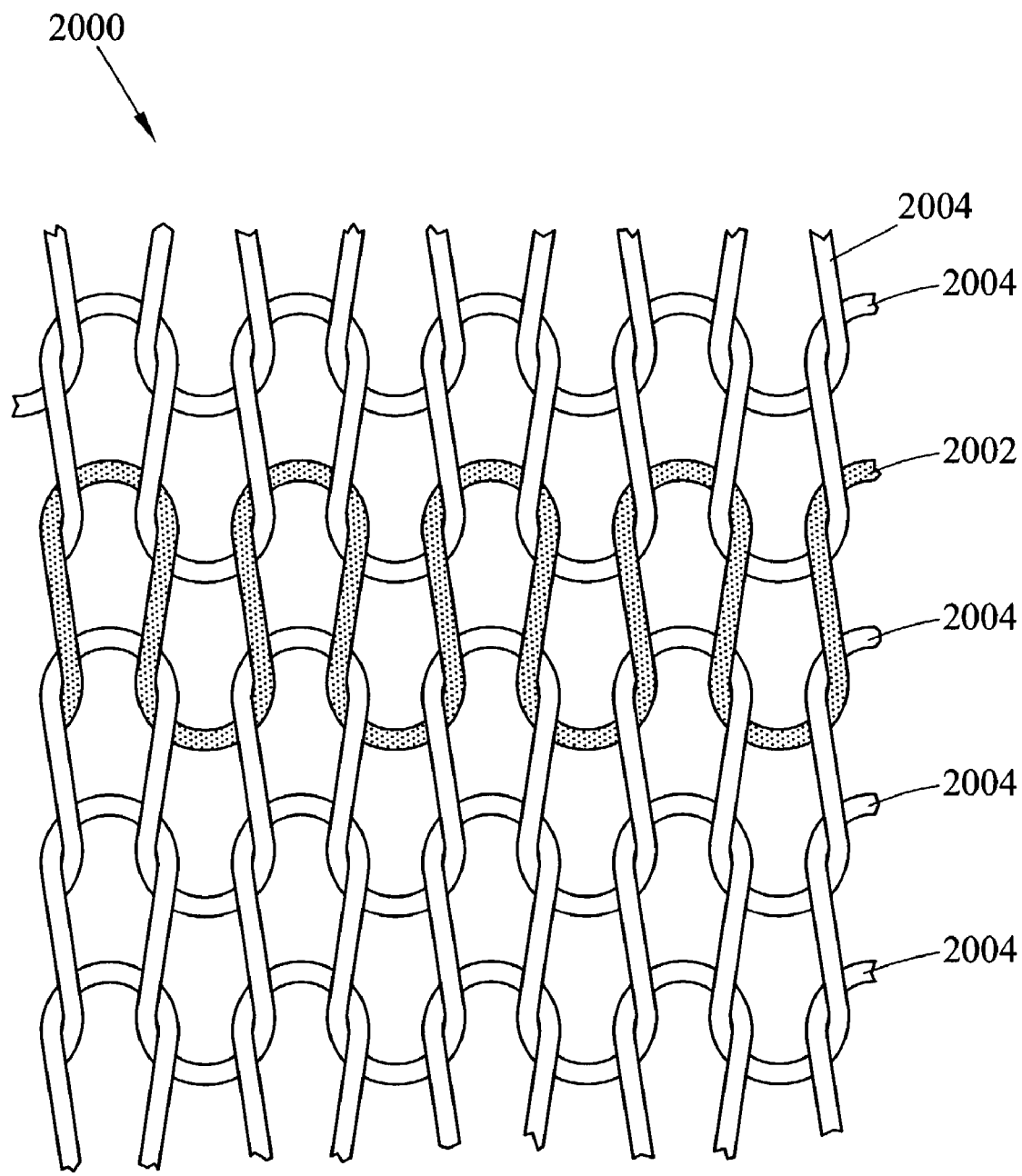
FIG. 20 is a top view of a fabric-based signal transmission system in which a coaxial conductive yarn structure is weft knitted into a fabric according to an embodiment of the present invention.

In addition to warp knitting, coaxial conductive yarn structure 100 can also be weft-knitted into a fabric. FIG. 20 illustrates an example in which coaxial conductive yarn structure 100 is weft-knitted in a fabric. In FIG. 20, a fabric-based signal transmission system 2000 includes a conductive yarn 2002 being weft knitted into a fabric with a plurality of other yarns 2004. In this example, conductive yarn 2002 may be similar in structure to coaxial conductive yarn structure 100 described above. In operation, conductor 102 may be connected to a signal source and conductor 106 may be connected to ground, resulting in improved signal integrity in weft-knitted fabric-based circuits.

Figure 21:
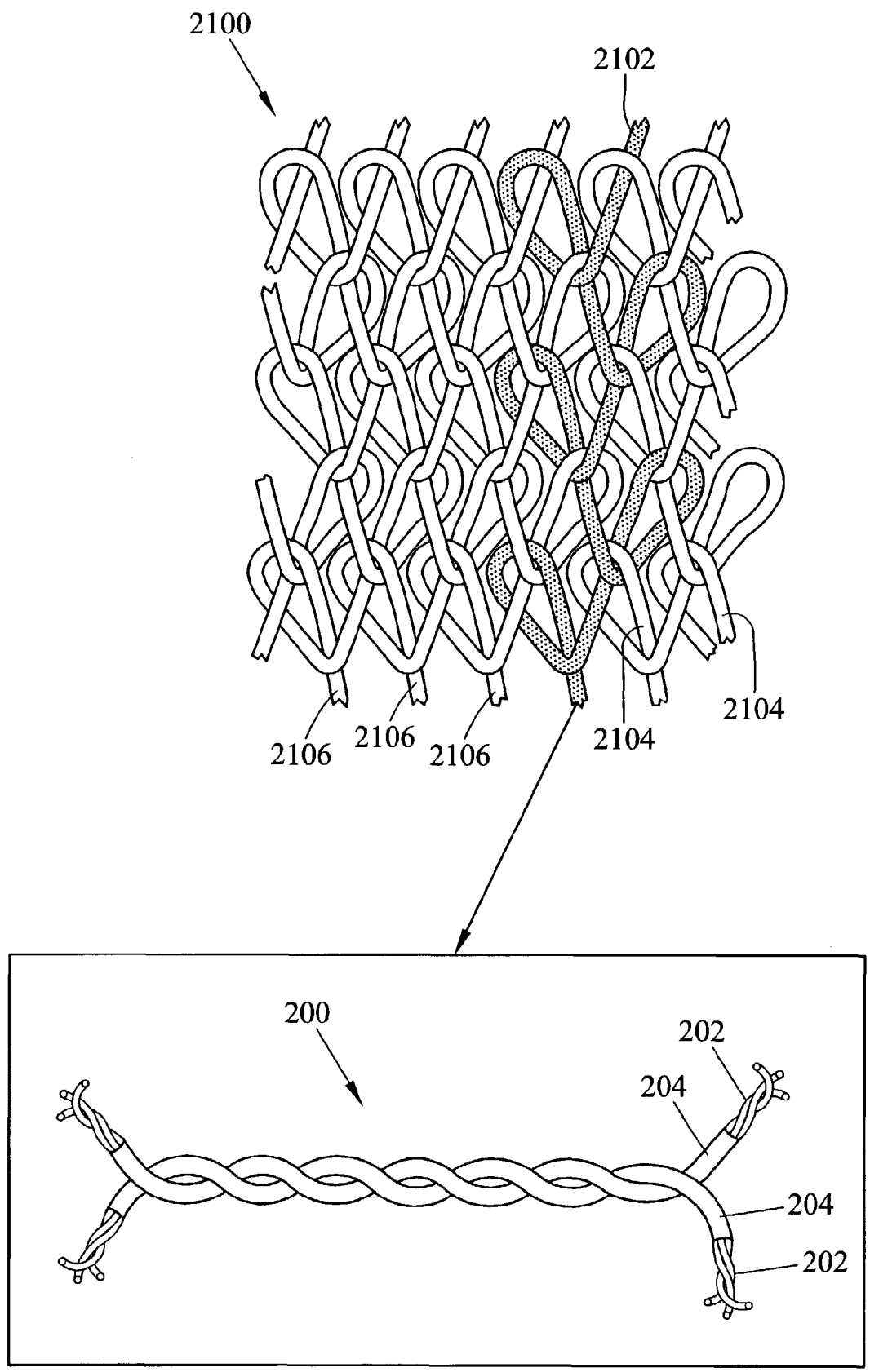
FIG. 21 is a top view of a fabric-based signal transmission system in which a twisted pair conductive yarn structure is warp knitted into a fabric according to an embodiment of the present invention.

As stated above, twisted pair conductive yarn structure 200 illustrated in FIG. 2 can also be knitted into a fabric. FIG. 21 illustrates an example of a fabric-based signal transmission system in which twisted pair conductive yarn structure 200 is weft knitted in a fabric. In FIG. 21, a fabric-based signal transmission system 2100 may include a conductive yarn 2102 being warp knitted in a fabric with a plurality of yarns 2106. In the illustrated example, conductive yarn 2102 is similar in structure to twisted pair conductive yarn structure 200 illustrated in FIG. 2. That is, conductive yarn 2102 may include first and second conductive yarns 202 being twisted together to form a helical structure. Each yarn 202 is preferably surrounded by an insulating layer 204 to prevent short-circuiting. In operation, one conductor 202 may be connected to a signal source, and the other conductor 202 may be connected to ground. Alternatively, conductors 202 may be oppositely driven to reject common mode noise.

Figure 22:
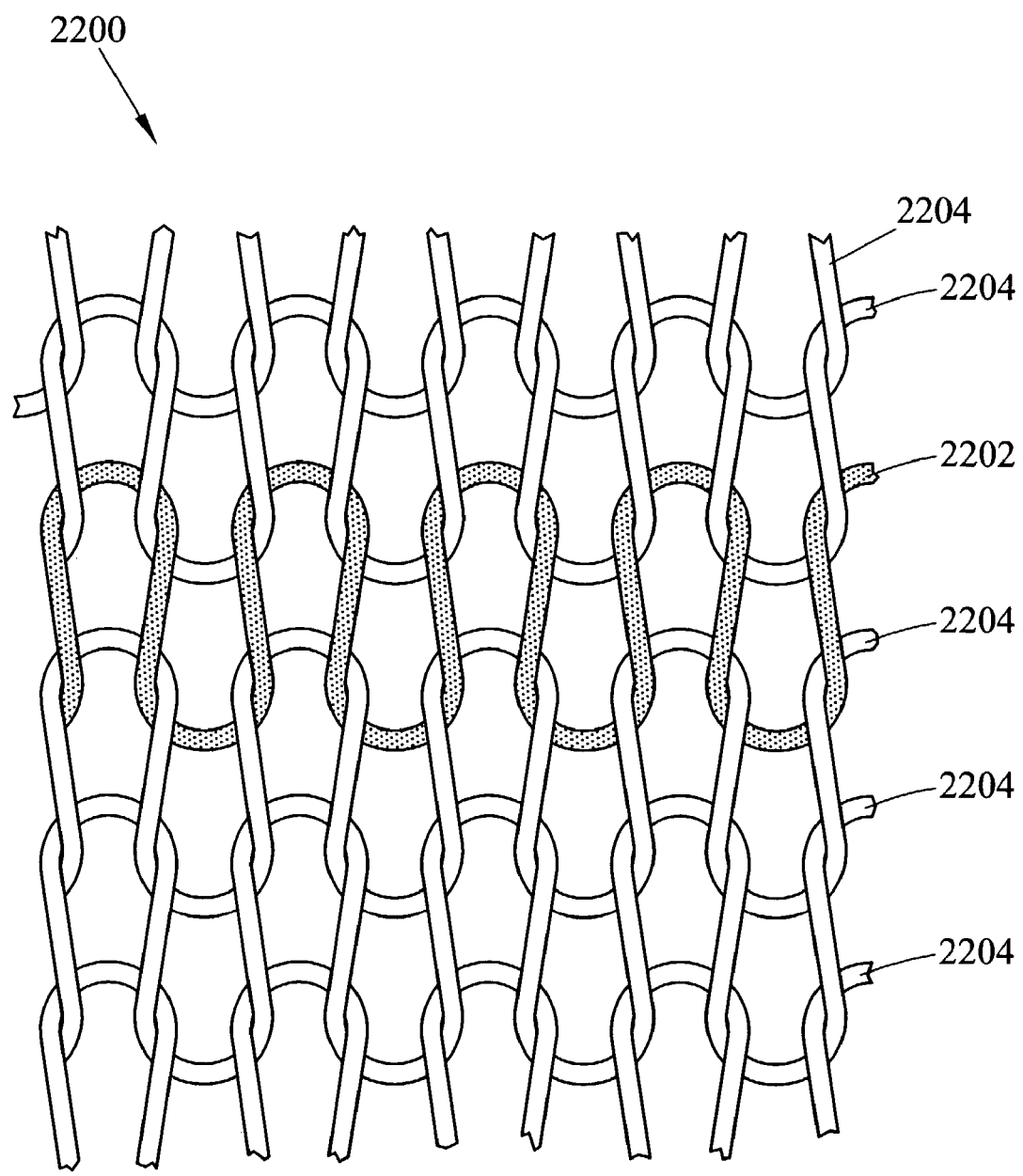
FIG. 22 is a top view of a fabric-based signal transmission system in which a twisted pair conductive yarn structure is weft knitted into a fabric to form a coaxial structure according to an embodiment of the present invention.

In addition to warp knitting, twisted pair conductive yarn structure 200 can be weft-knitted into a fabric. FIG. 22 illustrates a fabric-based signal transmission system 2200 in which twisted pair conductive yarn structure 200 is weft knitted in a fabric. In FIG. 22, a fabric-based signal transmission system includes a conductive yarn 2202 being weft knitted in a fabric with a plurality of additional yarns 2204. Conductive yarn 2202 may be similar in structure to twisted pair conductive yarn structure 200 described above. Yarns 2204 may be conductive or nonconductive. In operation, the conductors of yarn structure 2202 may be oppositely driven. Alternatively, one conductor of yarn 2202 may be connected to a signal source and the other conductor may be grounded, as described above.

In the examples illustrated in FIGS. 3 and 4, coaxial and twisted pair conductive yarn structures 100 and 200 are plain woven into a fabric. However, the present invention is not limited to plain weaving these structures into a fabric and other weaves, such as Twill, Basket, Satin, or Sateen could be used. In an alternate embodiment of the invention, these structures may be leno-woven into a fabric with other similar or different yarn structures to form additional coaxial or twisted pair structures and further improve signal integrity.

Similarly, in the examples illustrated in FIGS. 19-22, single coaxial and twisted pair yarn-structures 100 and 200 are warp or weft knitted into a fabric. However, the present invention is not limited to knitting single structures 100 or 200 into a fabric. In an alternate embodiment of the invention, multiple coaxial or twisted pair structures may be knitted together in a fabric to form additional coaxial and twisted pair structures as the fabric is being knitted.

Structures Involving Placement of Ground Lines and Planes

Figure 23:
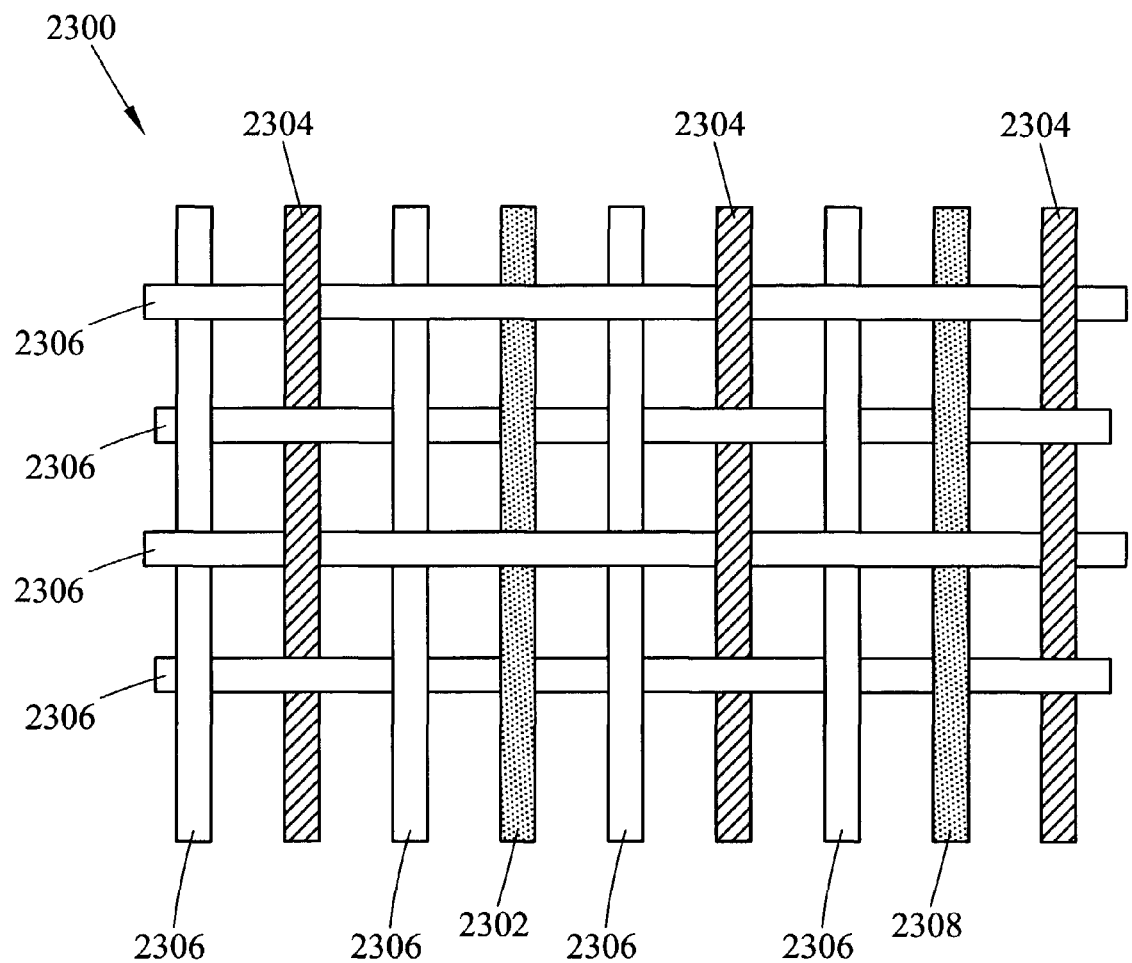
FIG. 23 is a top view of a fabric-based signal transmission system in which signal carrying conductive threads are separated by grounded conductors.

In a fabric-based circuit board, it is preferable that signal lines be surrounded by ground lines—one on each of its sides and running parallel to it. FIG. 23 illustrated an example of a fabric-based signal transmission system where the signal carrying threads are surrounded by ground threads according to an embodiment of the present invention. Referring to FIG. 23, a fabric-based signal transmission system 2300 includes an insulated conductive thread 2302 surrounded on both sides by insulated conductive threads 2304. Similarly, insulated conductive thread 2308 is surrounded on both sides by conductive threads 2304. Conductive threads 2302 and 2308 may be signal-carrying conductors and conductive threads 2304 may be connected to ground. Because conductive threads 2304 are connected to ground, crosstalk between conductive thread 2302 and neighboring conductive thread 2308 is reduced. The remaining threads 2306 illustrated in FIG. 23 are nonconductive.

In FIG. 23, conductive thread 2302 is surrounded on two sides by grounded conductors 2304 in a two-dimensional fabric-based circuit. Transmission line system 2300 may be similar to the structure of coplanar waveguides with signal conductor 2302 surrounded by grounded conductors 2304. That is, grounded conductive threads 2304 can also be multiple non-insulated parallel conducting threads in direct contact with each other to form wide grounded conducting structures surrounding signal carrying conducting threads 2302 as in a coplanar waveguide like structure. In a three-dimensional fabric-based circuit, conductive thread 2302 may be surrounded on four sides by grounded conducting elements—from above, below, and from both sides in the plane in which conductive thread 2302 is located.

Figure 24A:
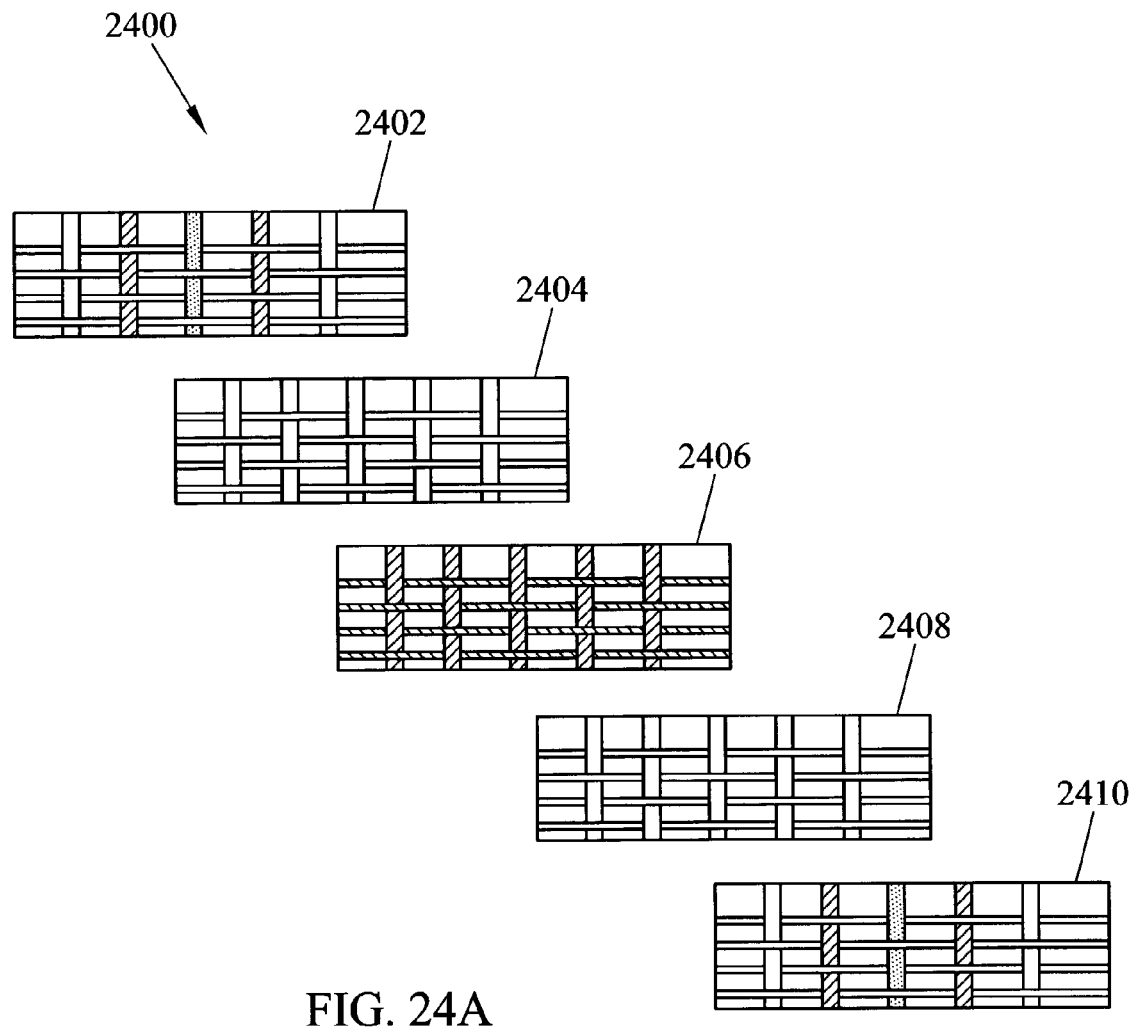
FIGS. 24A and 24B illustrate multi-layered fabric-based signal transmission systems according to embodiments of the present invention.
Figure 24B:
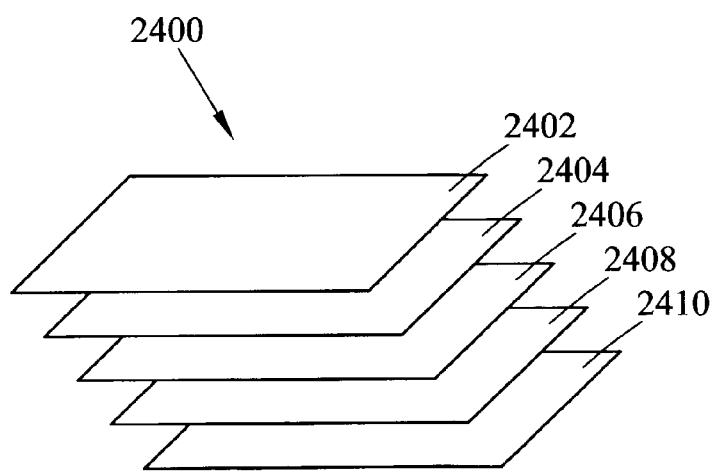

The methods and systems for improving signal integrity in fabric-based signal transmission systems may be used to form single or multi-layered electrical circuits. FIGS. 24A and 24B illustrate examples of multi-layered fabric-based circuits in which the fabric-based signal transmission systems of the present invention may be utilized. In FIGS. 24A and 24B, a multi-layered signal transmission system 2400 includes a plurality of layers for forming a woven electrical network. These layers can be different fabrics stacked together (with or without a stitch) or could be different layers of a single multilayered fabric structure developed on a loom. In the illustrated example, these layers include a conductive layer 2402, an insulating layer 2404, a second conductive layer 2406, a second insulating layer 2408, and a third conductive layer 2410. Conductive layers 2402 and 2410 may be signal-carrying layers similar in structure to the fabric-based signal transmission system illustrated in FIG. 23. Insulating layers 2404 and 2408 may include a plurality of nonconductive threads woven or knitted together to form a barrier between adjacent conductive layers. Conductive layer 2406 may be made entirely of conductive threads to form an electromagnetic shield between conductive layers 2402 and 2410.

In FIG. 24B, it can be seen that in operation, layers 2402-2410 are located on top of each other, resulting in an increased chance of crosstalk between layers. However, because layer 2406 is preferably grounded, interlayer crosstalk is reduced. Using a ground plane can also reduce simultaneous switching noise (SSN). The multilayered fabric structures with signal carrying layers and ground plane layers are similar to some transmission line structures in conventional circuit boards and integrated circuits, such as but not limited to microstrip lines and striplines.

The present invention is not limited to forming multilayered woven circuits. Any combination of woven layers, knitted layers, or knitted and woven layers is intended to be within the scope of the invention.

Figure 25:
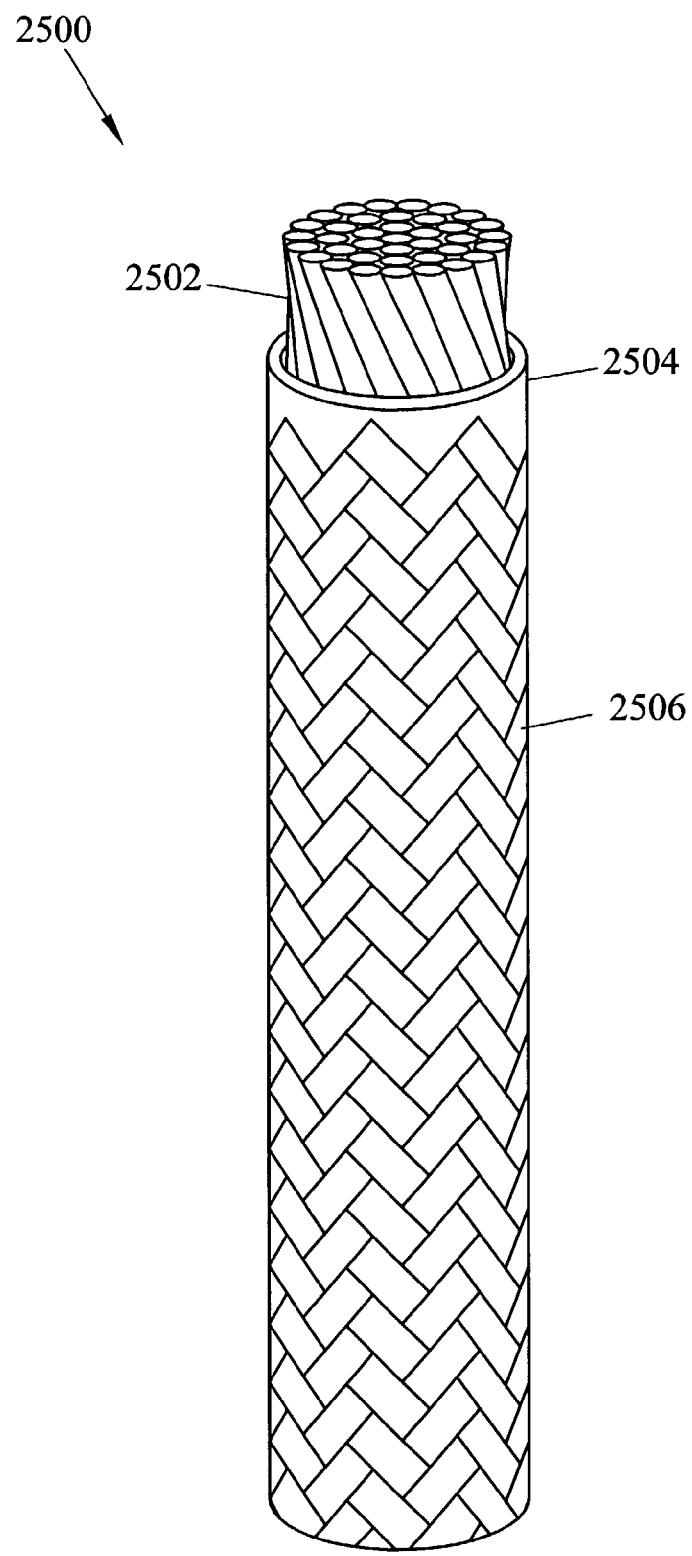
FIG. 25 is a perspective view of an insulated conductive yarn structure surrounded by a braided outer conductor according to an embodiment of the present invention.

Braided and other Coaxial Yarn Structures and Fabric Woven or Knitted from such Structures Although the examples described above relate primarily to wrapped or twisted thread or yarn structures, the present invention is not limited to such structures. In an alternate embodiment of the invention, conductive yarn structures may be braided. FIG. 25 illustrates an example of a coaxial conductive yarn structure including a braided outer conductor according to an embodiment of the present invention. In FIG. 25, a coaxial conductive yarn structure includes an inner conductor 2502 including a plurality of strands being twisted together, an insulating layer 2504, and a braided outer conductor a braided outer conductor 2506. Examples of conductive strand material suitable for use with the present invention include copper, steel, gold, aluminum, silver, iron, any of the alloys from the above mentioned materials, and conductive polymers (inherently conductive polymeric materials, such as polypyrrole, polyacetylene, polythiophene and polyaniline, doped conductive polymeric materials, carbon black-doped/impregnated polymeric yarns, metal coated polymeric yarns or fibers and conductive yarns of all different kinds). Insulating layer may be made up of materials, such as polyvinylchloride, rubber, rubber forming polymers, including polyisoprene, polybutadiene, polychloroprene, polyisoutylene, polyesters, polyolefins, and polyamides.

Figure 26:
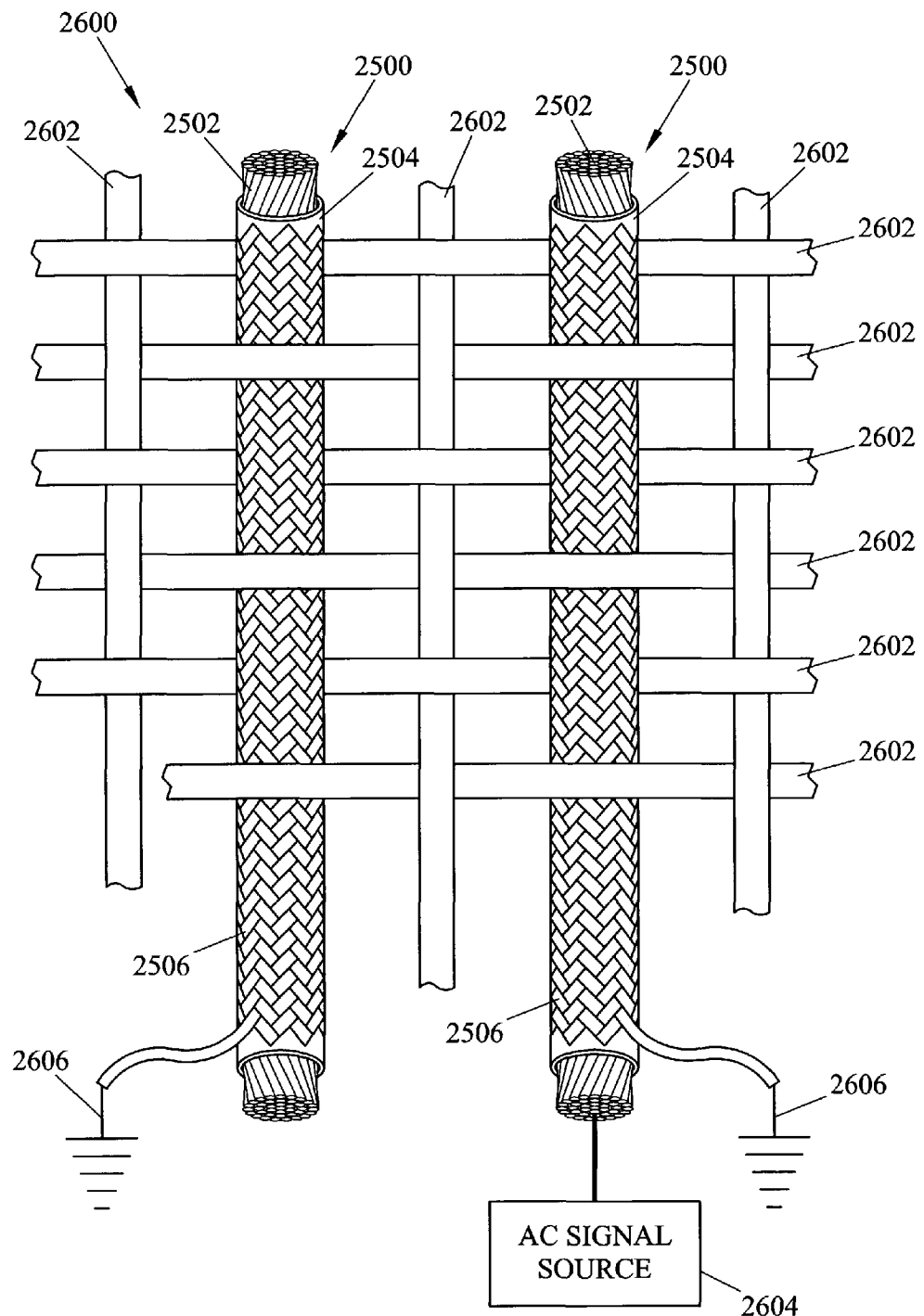
FIG. 26 is a top view of a fabric-based signal transmission system in which braided coaxial yarn structures are woven parallel to each other in a fabric according to an embodiment of the present invention.

Braided coaxial conductive yarn structures 2500 can be woven into a fabric to form a fabric-based signal transmission system. FIG. 26 illustrates an example of a fabric-based signal transmission system including braided coaxial conductive yarn structures according to an embodiment of the present invention. Referring to FIG. 26, a fabric-based signal transmission system 2600 includes braided coaxial conductive yarn structures 2500 woven into a fabric with yarns 2602. Yarns 2602 may be conductive or nonconductive. If yarns 2602 are conductive, they are preferably insulated. Inner conductive yarn 2502 of one of conductive yarn structures 2500 is connected to a signal source 2604. The outer braids of structures 2500 are preferably connected to ground 2606. Because the outer braids of structures 2500 are grounded, crosstalk between adjacent structures 2500 is reduced. More particularly, when an AC signal is applied to inner conductive yarn 2502 of one or both of coaxial conductive yarn structures 2500, outer braids 2506 of braided coaxial conductive yarn structures 2500 block electromagnetic fields emanating from the inner conductive yarn 2502 connected to signal source 2604.

Figure 27:
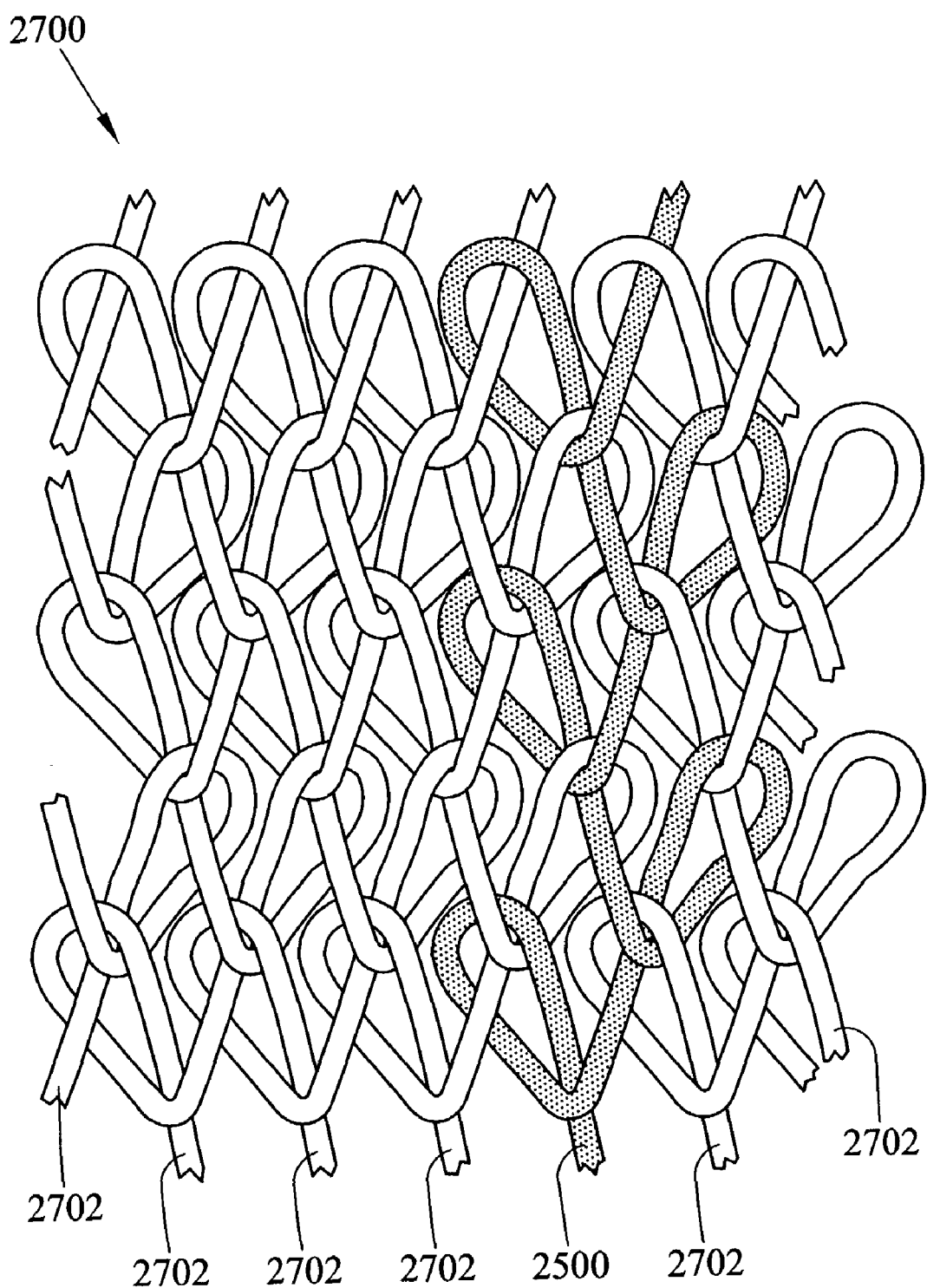
FIG. 27 is a top view of a fabric-based signal transmission system in which a braided coaxial yarn is warp knitted into a fabric according to an embodiment of the present invention.

A braided coaxial conductive yarn structure can be knitted into a fabric to form a fabric-based signal transmission system with improved signal integrity characteristics. FIG. 27 illustrates a fabric-based signal transmission system in which a braided coaxial conductive yarn structure is knitted into a fabric according to an embodiment of the present invention. In FIG. 27, braided coaxial conductive yarn structure 2500 is warp knitted into a fabric with other yarns 2702, which are preferably nonconductive. As with the embodiment illustrated in FIG. 26, the braided outer conductor of yarn 2500 is preferably grounded to improve signal integrity for the inner conductor. Because the braided outer conductor is grounded, yarn structures, such as structure 2500 can be placed close together in a fabric without adversely affecting each other.

Figure 28:
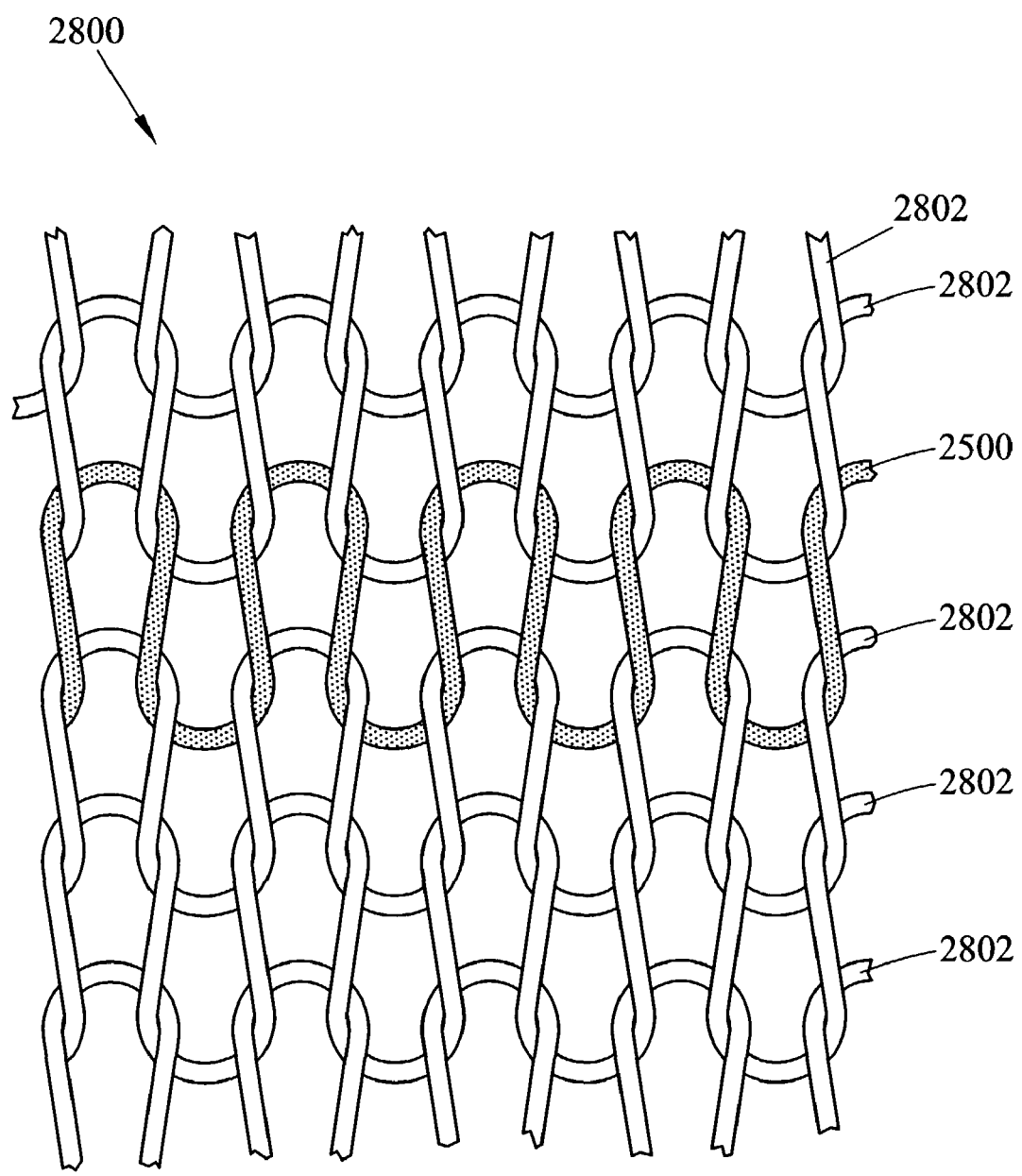
FIG. 28 is a top view of a fabric-based signal transmission system in which a braided coaxial yarn is weft knitted into a fabric according to an embodiment of the present invention.

In addition to warp knitting, braided coaxial conductive yarn structure 2500 may also be weft knitted into a fabric. FIG. 28 illustrates an example of a braided coaxial conductive yarn structure being weft knitted in a fabric. In particular, a fabric-based signal transmission system 2800 includes braided coaxial conductive yarn structure 2500 being weft knitted with other yarns 2802 in a fabric. Yarns 2802 are preferably nonconductive. In this configuration, the outer conductor of yarn structure 2500 is preferably connected to ground, and the inner conductor is preferably connected to a signal source. Because the outer conductor is grounded, electromagnetic fields have a reduced effect on the signal on the inner conductor. In addition, the signal on the inner conductor of braided conductive yarn structure 2502 will have a reduced effect on other conductors. As a result, braided coaxial conductive yarn structures can be placed closer together, and fabric-based circuit density is increased.

Although in the examples illustrated above, the outer conductor in coaxial conductive yarn structures is either wrapped or braided onto the insulating layer the surrounds the inner conductor, the present invention is not limited to such an embodiment. In an alternate embodiment, an outer conductive layer may be coated or sputtered with a conductive layer using a conductive material that adheres on to the insulation around the first conductor) to form a coaxial yarn. This structure can also be woven or knitted to form fabric-based circuits with reduced crosstalk noise.

In the examples set forth above, conductive yarn structures are described as containing metallic fibers being twisted together to form a single conductor with an insulating layer surrounding the conductor and a second conductor surrounding the insulating layer. In an alternate embodiment of the invention, a conductive yarn structure may include a core of coaxial monofilament yarn/fiber produced by fiber spinning of a structure having a conductive material as the core (i.e., made from inherently conductive polymeric materials, such as polypyrrole, polyacetylene, polythiophene and polyaniline, doped conductive polymeric materials, carbon black-doped/impregnated polymeric material, polymeric material containing metal particles and any other kind of spinnable conducting material), an insulating material surrounding the core, and a conductive material covering the insulation. This yarn structure can also be woven or knitted to form fabric-based circuits with reduced crosstalk noise.

Figure 29:
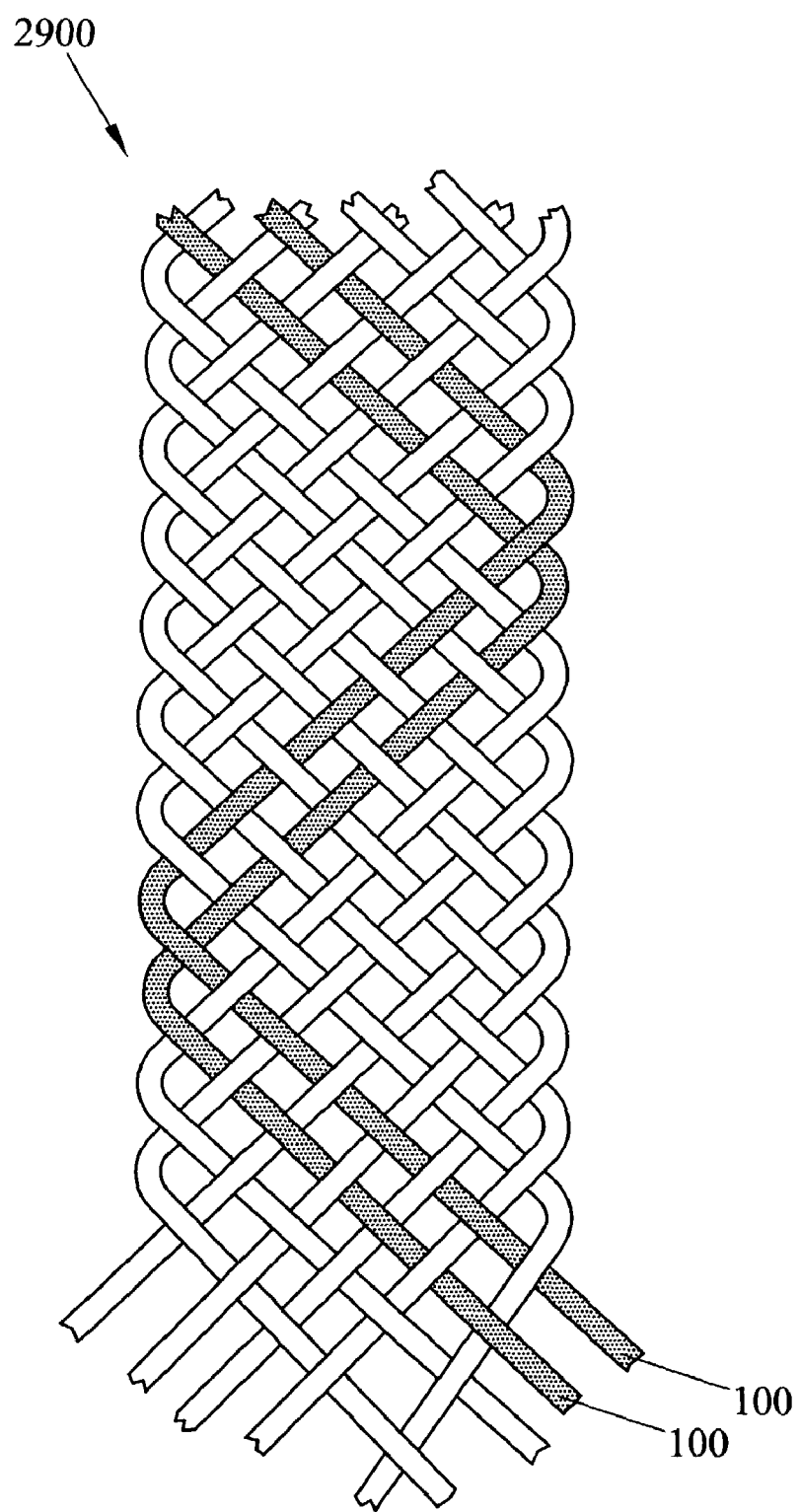
FIG. 29 is a top view of a fabric-based signal transmission system including a plurality of coaxial conductive yarn structures being braided into a fabric according to an embodiment of the present invention.

Braided Yarn Structures Developed from Coaxial and Twisted Pair Yarn Structures and Fabric Woven or Knitted from Such Structures Braided conductive yarn structures can be developed from wrapped coaxial conductive yarn structures described above. FIG. 29 illustrates braiding of coaxial yarn structures 100 into a single braided conductive yarn. In FIG. 29, a braided conductive yarn structure 2900 includes wrapped coaxial conductive yarns 100. Different electronic devices, such as sensors, microphones, and integrated circuits may be connected to the inner conductor 102 of the different coaxial yarns 100 in this braided yarn structure 2900. Outer conductors 106 of coaxial conductive yarn structures 100 may be connected to ground.

Figure 30:
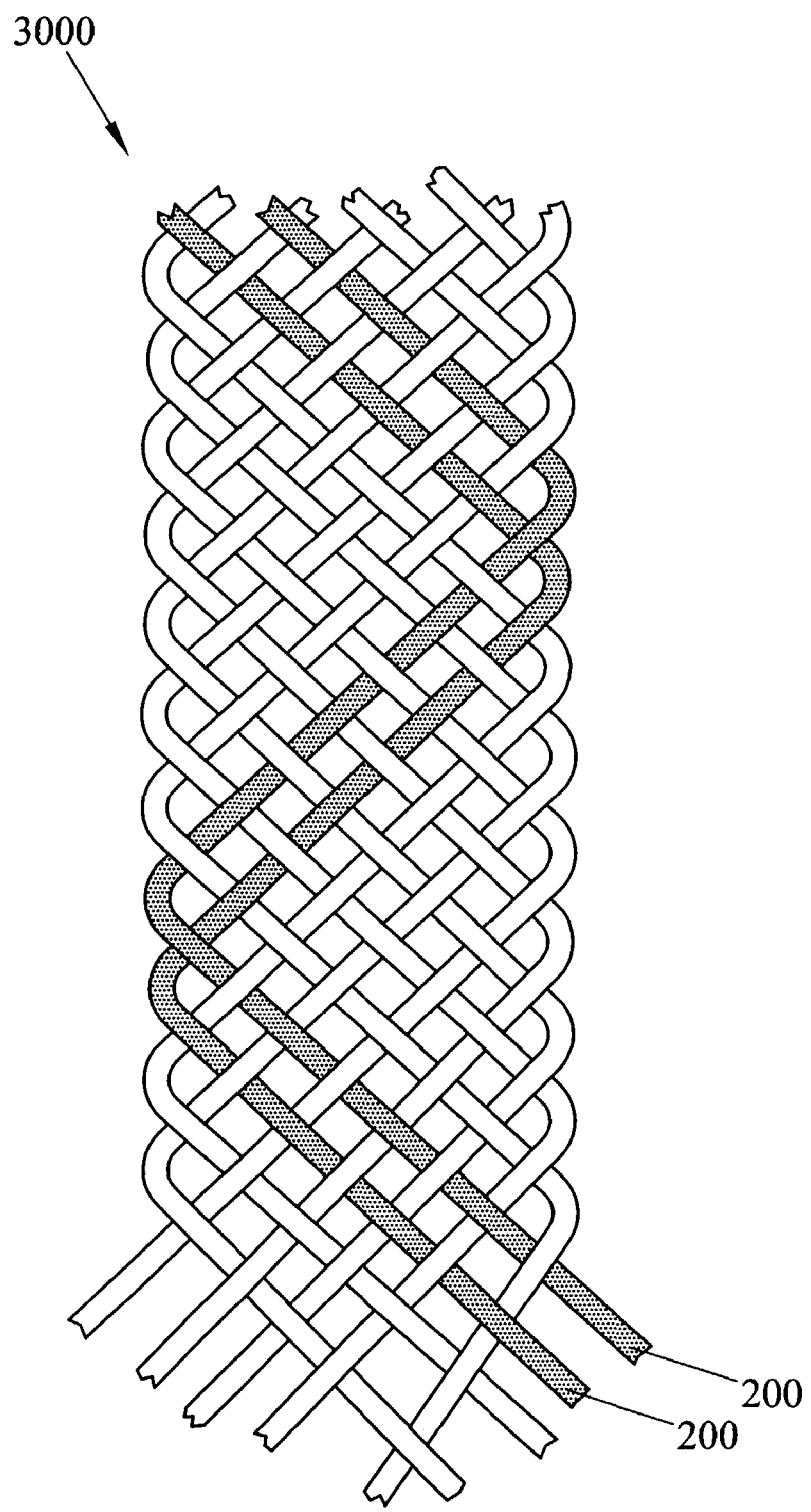
FIG. 30 is a top view of a fabric-based signal transmission system including a plurality of twisted pair conductive yarns being braided into a fabric according to an embodiment of the present invention.

Braided conductive yarn structures can also be developed from twisted pair conductive yarn structures described above. FIG. 30 illustrates braiding of twisted pair yarn structures 200 into a single braided conductive yarn. In FIG. 30, a braided conductive yarn structure 3000 includes twisted pair conductive yarn structures 200. Different electronic devices, such as sensors, microphones, and integrated circuits can be connected to one of the two conductive yarns 202 of the different twisted pair conductive yarn structures 200 in braided yarn structure 3000. The other conductive yarn 202 of twisted pair yarn structures 200 may be connected to ground.

Figure 31:
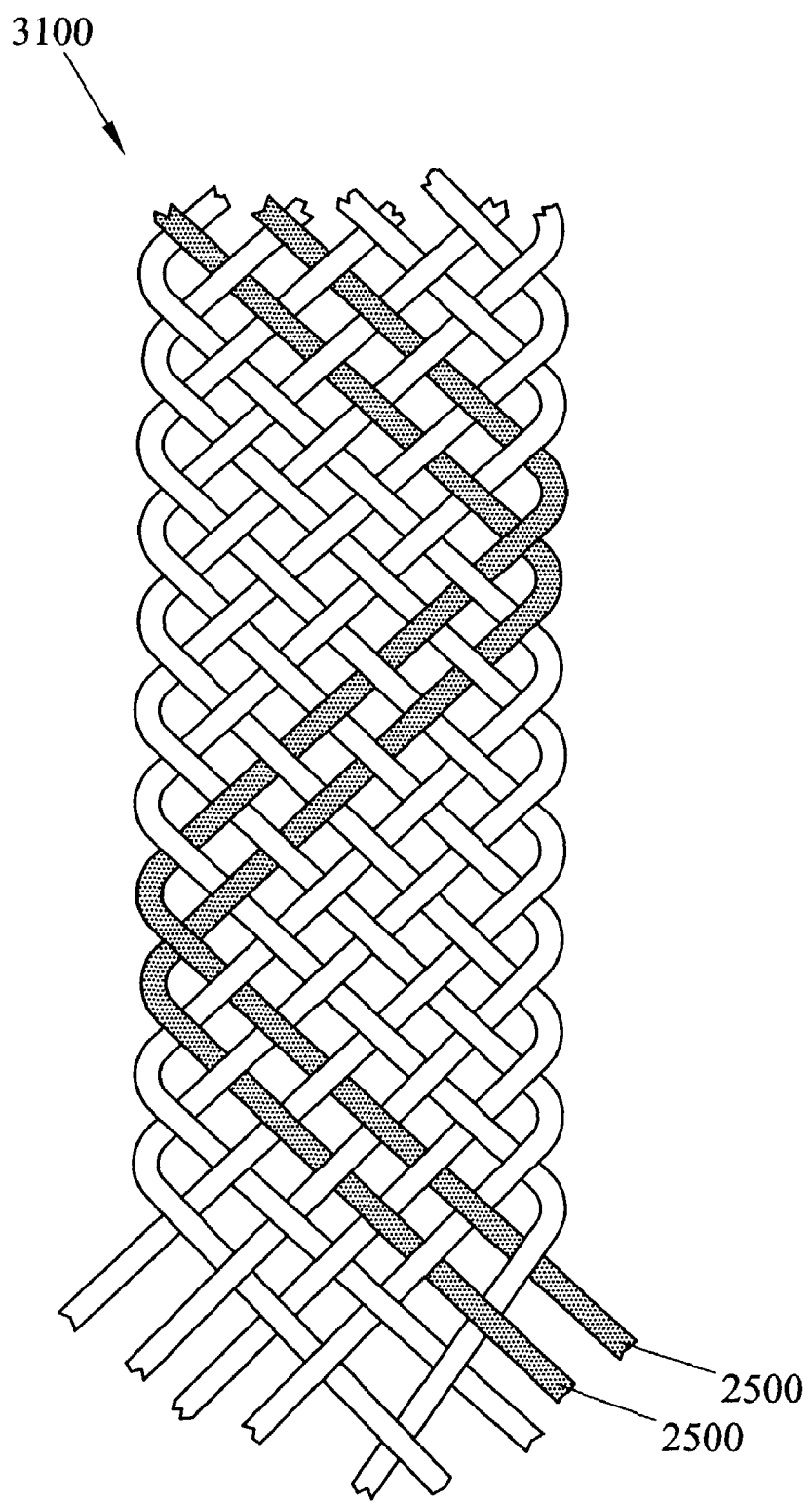
FIG. 31 is a top view of a fabric-based signal transmission system including a plurality of braided coaxial conductive yarn structures being braided into a fabric according to an embodiment of the present invention.

Braided conductive yarn structures can be also developed from braided coaxial conductive yarn structures described above. FIG. 31 illustrates braiding of braided coaxial yarn structures 2500 into a single braided conductive yarn. In FIG. 31, a braided conductive yarn structure 3100 includes braided coaxial conductive yarns 2500. Different electronic devices, such as sensors, microphones, and integrated circuits, can be connected the inner conductor 2502 of the different coaxial yarns 2500 in this braided yarn structure 3100. Braided outer conductors 2506 of the coaxial yarns 2500 can be connected to ground.

Conductive braided yarn structures 2900, 3000, and 3100 can be developed on a standard braided yarn manufacture machine. The advantage of using braided conductive yarn structures 2900, 3000, and 3100 is that they allow a large number of conductive yarns to be incorporated into one braided yarn structure. Thus, a very high density of coaxial and twisted pair yarns in one conductive braided yarn structure can be achieved. These conductive braided yarn structures can be integrated into a fabric (by weaving or knitting them into a fabric) thereby increasing the density of coaxial and twisted pair threads in the fabric.

Another advantage of conductive braided yarn structures 2900, 3000, or 3100 is that small-sized electronic devices, such as sensors, microphones, and integrated circuits, can be connected to the coaxial or twisted pair conductors of the conductive braided yarn in a manner such that they are hidden and protected in the core of the braided structures 2900, 3000, or 3100. Incorporating electronic devices in the core of braided yarn structures 2900, 3000, or 3100 may be possible when the braided conductive yarn structure has a hollow core and the electronic devices are smaller than the hollow region in the core of the braided yarn structures 2900, 3000, or 3100. Incorporating electronic devices within the core of braided yarn structures 2900, 3000, or 3100 makes the electronic devices invisible on the surface of the fabric into which braided yarns 2900, 3000, or 3100 are integrated. Moreover, the electronic devices can first be attached to the twisted pair or coaxial yarns of the conductive braided yarn structures 2900, 3000, or 3100 and then integrate these structures into a fabric by weaving and knitting.

Figure 32:
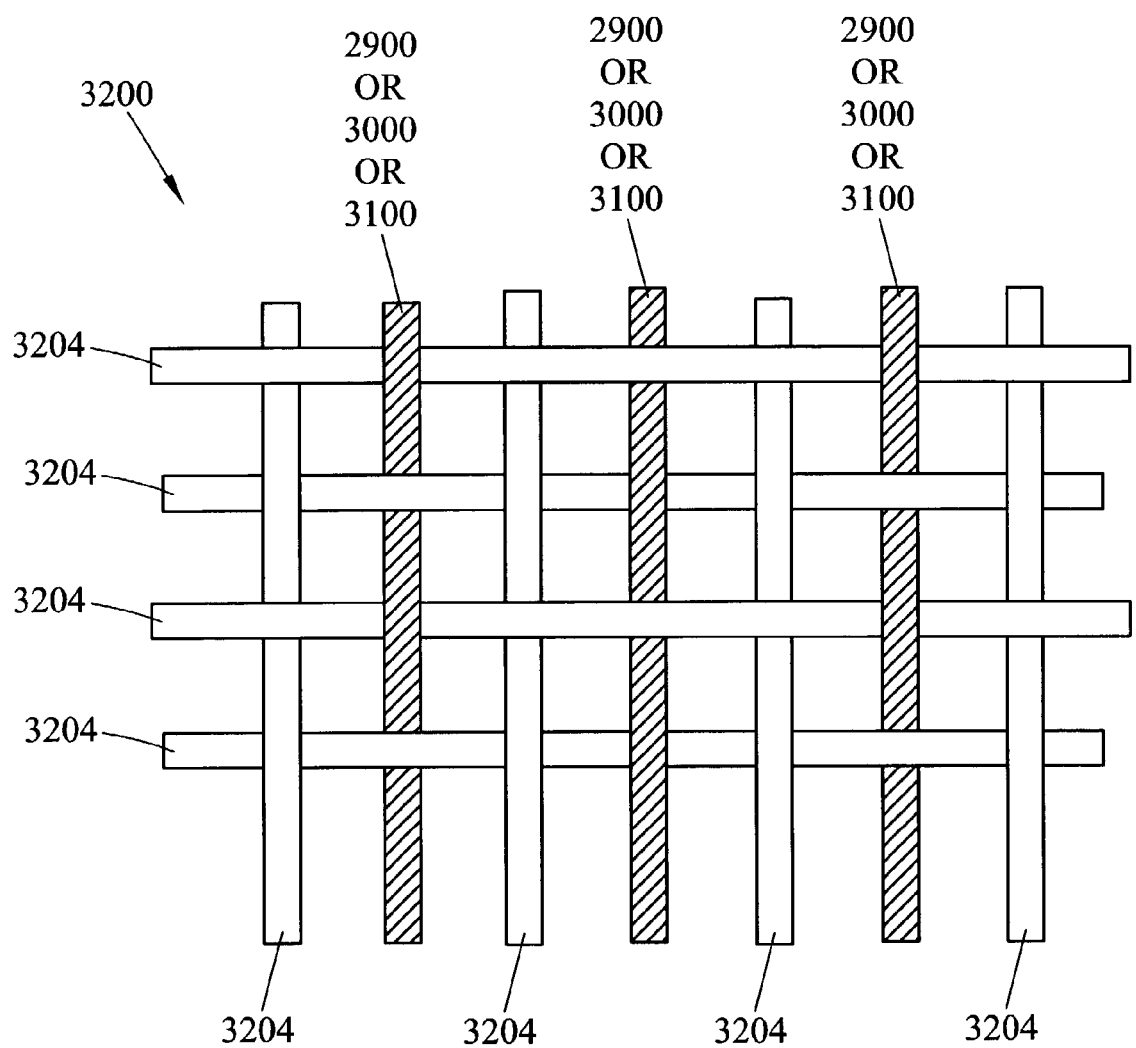
FIG. 32 is a top view of a fabric-based signal transmission system including a woven fabric having a plurality of braided conductive yarn structures according to an embodiment of the present invention.

Braided conductive yarn structures 2900, 3000 or 3100 can be woven into a fabric to form a fabric-based signal transmission system. FIG. 32 illustrates an example of a fabric-based signal transmission system including braided conductive yarn structures according to an embodiment of the present invention. Referring to FIG. 32, a fabric-based signal transmission system 3200 includes conductive braided yarn structures 2900, 3000 or 3100 woven into a fabric with yarns 3204. Yarns 3204 may be conductive (with an insulating layer around the conductive yarns) or nonconductive.

Figure 33:
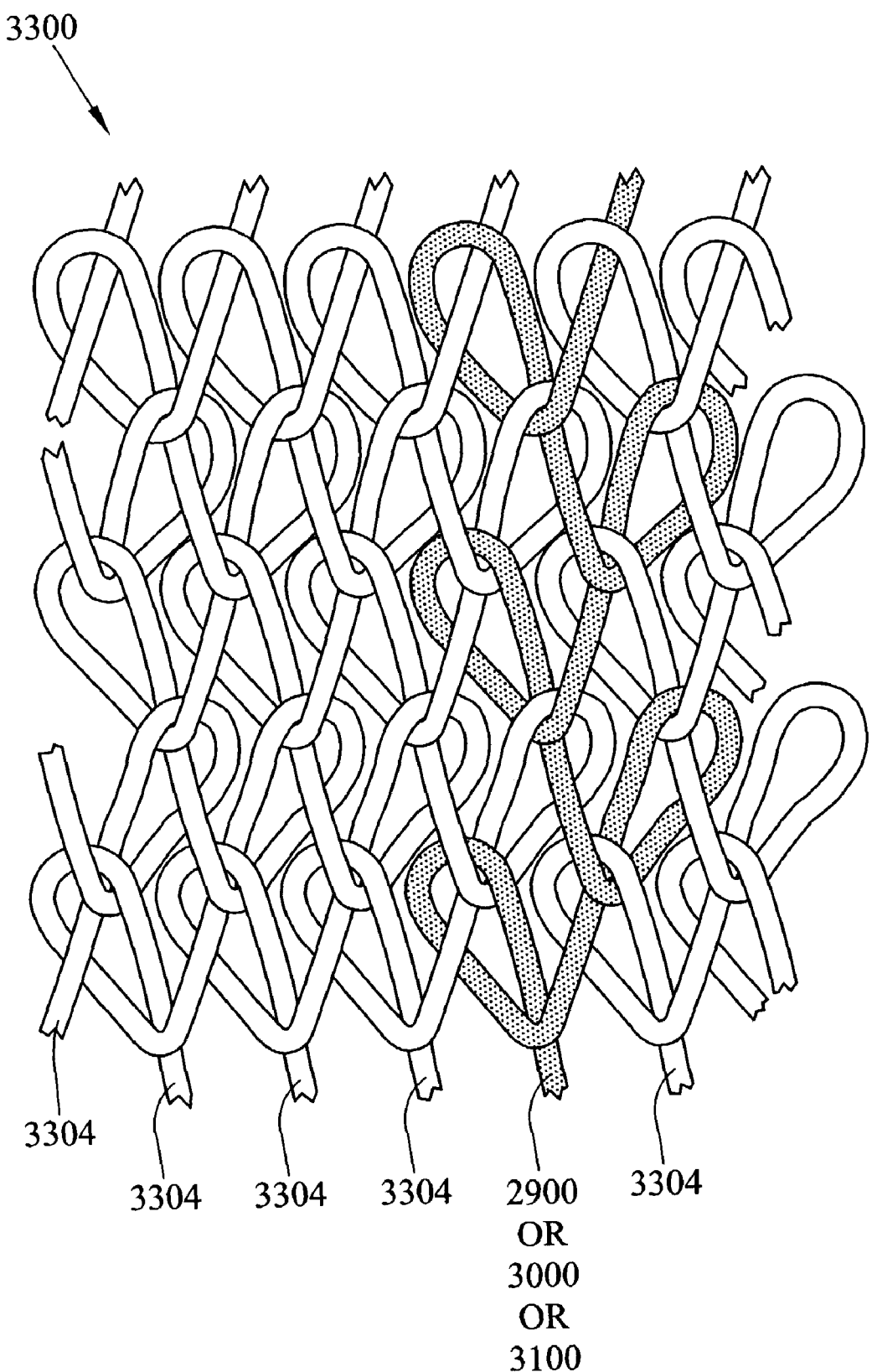
FIG. 33 is a top view of a fabric-based signal transmission system including a warp-knitted fabric having a plurality of braided conductive yarn structures according to an embodiment of the present invention.

Braided conductive yarn structures 2900, 3000 or 3100 can also be warp knitted into a fabric to form a fabric-based signal transmission system. FIG. 33 illustrates an example of a fabric-based signal transmission system including braided conductive yarn structures according to an embodiment of the present invention. Referring to FIG. 33, a fabric-based signal transmission system 3300 includes conductive braided yarn structures 2900 or 3000 or 3100 warp knitted into a fabric with yarns 3304. Yarns 3304 may be conductive (with an insulating layer around the conductive yarns) or nonconductive.

Figure 34:
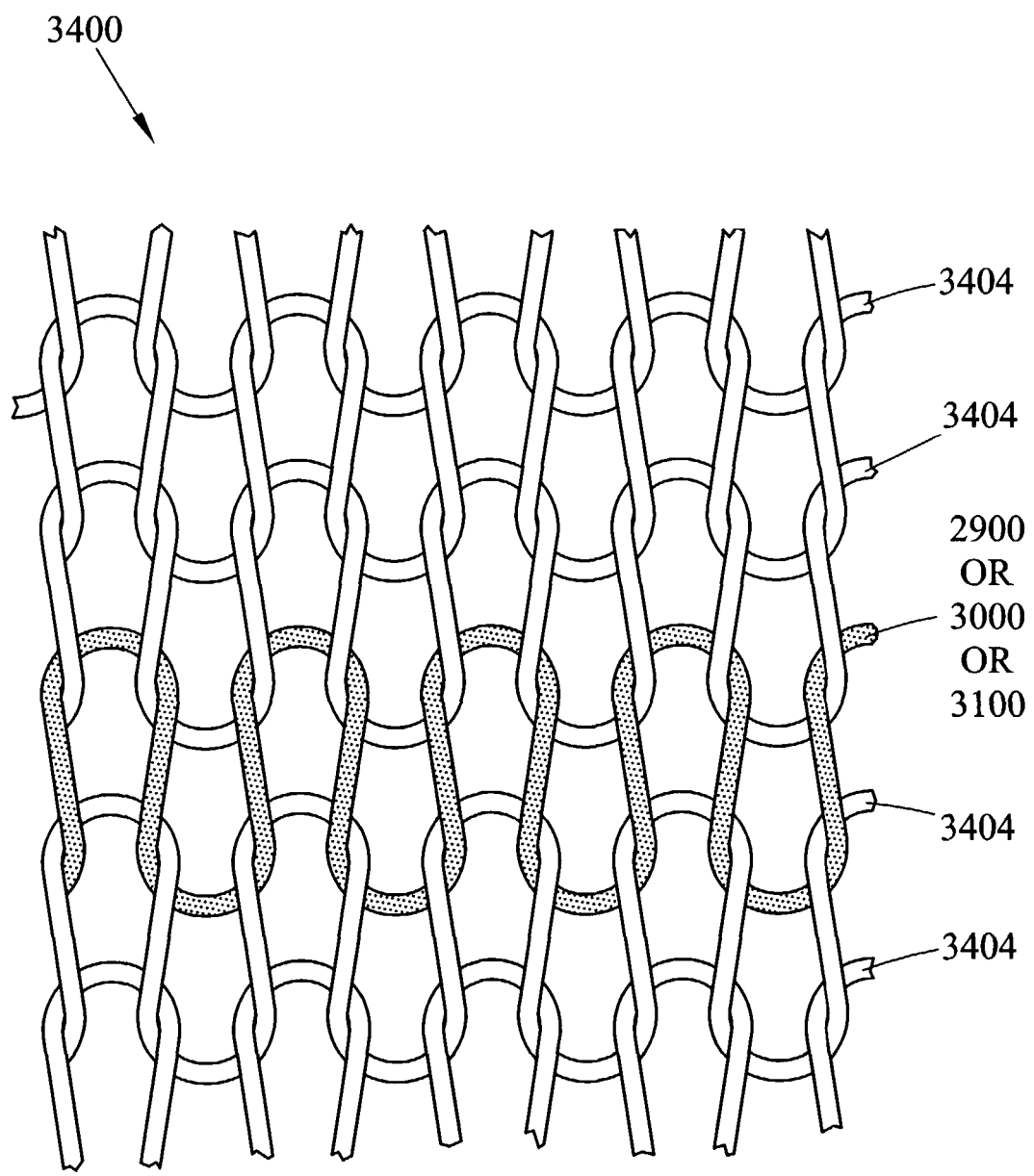
FIG. 34 is a top view of a fabric-based signal transmission system including a weft-knitted fabric having a plurality of braided conductive yarn structures according to an embodiment of the present invention

Braided conductive yarn structures 2900, 3000 or 3100 can also be weft knitted into a fabric to form a fabric-based signal transmission system. FIG. 34 illustrates an example of a fabric-based signal transmission system including braided conductive yarn structures according to an embodiment of the present invention. Referring to FIG. 34, a fabric-based signal transmission system 3400 includes conductive braided yarn structures 2900, 3000 or 3100 weft knitted into a fabric with yarns 3404. Yarns 3404 may be conductive (with an insulating layer around the conductive yarns) or nonconductive.

EXPERIMENTAL RESULTS

In experiments using yarn structures of the present invention, the crosstalk on adjacent lines using yarn structures according to the present invention is significantly reduced over nongrounded conductive yarn structures. For example, the reduction in crosstalk noise appearing on a quiet line in one of the experiments was reduced by a factor of nearly five. Because the present invention greatly reduces crosstalk in woven and other fabric-based networks, conductive yarn structures can be spaced more closely to each other in fabric-based networks. Consequently, component density can be increased without increasing circuit board area.

Thus, the present invention includes conductive yarn, thread, and fabric structures with improved signal integrity characteristics. In addition, the present invention includes methods for making yarn and thread structures while these structures are being knitted or woven into a fabric. Such methods decrease the time required to produce fabric-based electric circuits and facilitate creation of regions in the threads for electrical device interconnection and disconnection.

It will be understood that various details of the invention may be changed without departing from the scope of the invention. Furthermore, the foregoing description is for the purpose of illustration only, and not for the purpose of limitation—the invention being defined by the claims.

What is claimed is:

1. A woven electrical network comprising:
    (a) a first coaxial conductive yarn structure being woven into a fabric in a first direction, the first coaxial conductive yarn structure including an inner conductive yarn, an outer conductive yarn being wound around the inner conductive yarn in a second direction transverse to the first direction and substantially covering the inner conductive yarn, and at least one insulating layer for electrically isolating the inner and outer conductive yarns from each other, wherein the outer conductive yarn is connected to ground;
    (b) a second coaxial conductive yarn structure being woven into the fabric in the first direction and being spaced from the first coaxial conductive yarn structure, the second coaxial conductive yarn structure including an inner conductive yarn, an outer conductive yarn being wound around the inner conductive yarn in a second direction transverse to the first direction and substantially covering the inner conductive yarn, and an insulating layer for electrically isolating the inner and outer conductive yarns from each other, wherein the outer conductive yarn is connected to ground; and
    (c) an AC signal source being connected to the inner conductive yarn of the first coaxial conductive yarn structure for sending an AC signal over the first coaxial conductive yarn structure, wherein the grounded outer conductive yarns of the first and second coaxial conductive yarn structures block electromagnetic fields emanating from the inner conductive yarn of the first coaxial conductive yarn structure and thereby reduce crosstalk between the first and second coaxial conductive yarn structures.

2. The woven electrical network of claim 1 wherein the inner conductive yarns of the first and second coaxial conductive yarn structures each include a plurality of conductive strands being twisted together with each other.

3. The woven electrical network of claim 1 wherein the outer conductive yarns of the first and second coaxial conductive yarn structures each include a plurality of strands being twisted together with each other.

4. The woven electrical network of claim 3 wherein the strands of the outer and inner conductive yarns each comprise a conductive material selected from a group including metals, alloys, and conductive polymers.

5. The woven electrical network of claim 1 wherein the insulating layers of the first and second coaxial yarn structures comprise an electrically insulating material selected from a group including polyvinylchloride; rubber; rubber forming polymers, including polyisoprene, polybutadiene, polychloroprene, and polyisobutylene; polyesters; polyolefins; and polyamides.

6. The woven electrical network of claim 1 wherein the insulating layers of the first and second coaxial conductive yarn structures are substantially uniform in thickness.

7. The woven electrical network of claim 1 wherein the first and second coaxial conductive yarn structures are spaced from each other in the fabric by a predetermined distance.

8. The woven electrical network of claim 7 wherein the predetermined distance ranges from about one hundredth of an inch to no more than about one inch.

9. The woven electrical network of claim 1 comprising a plurality of nonconductive yarns being woven in the fabric with the first and second coaxial conductive yarn structures.

10. The woven electrical network of claim 9 wherein the nonconductive yarns each comprise a material selected from a group including polyamides, including nylon; polyurethane; polyimides; polyesters; acrylics, acetate materials; viscose materials; and natural fibers, including wool, silk, and cotton.

11. The woven electrical network of claim 1 wherein the first and second coaxial conductive yarn structures comprise warp yarns.

12. The woven electrical network of claim 1 wherein the first and second coaxial conductive yarn structures comprise weft yarns.

13. The woven electrical network of claim 1 wherein the inner and outer conductive yarns of the first and second coaxial conductive yarn structures each exhibit at least one of sufficient flexibility, conformability, resiliency, bending characteristics, and recovery for incorporation in a wearable garment.

14. The woven electrical network of claim 1 wherein the inner and outer conductive yarns of the first and second coaxial conductive yarn structures each comprise a plurality of strands being twisted together and having a diameter of less than twenty microns.

15. The woven electrical network of claim 1 wherein the inner and outer conductive yarns of the first and second coaxial conductive yarn structures each comprise a monofilament yarn having a diameter less than twenty microns.

* * * * *